United States Patent [19]
Doi et al.

[11] Patent Number: 5,520,733
[45] Date of Patent: May 28, 1996

[54] DEPOSITION APPARATUS AND PROFILE-FOLLOWING DEVICE SUITABLE FOR APPARATUSES SUCH AS THOSE FOR DEPOSITION

[75] Inventors: Hiroyuki Doi; Shinichi Kazui, both of Hadano; Takeji Shiokawa, Kanagawa-ken; Keiji Fujikawa, Hadano; Yutaka Hashimoto, Ebina; Makoto Matsuoka, Hadano, all of Japan

[73] Assignee: Hitachi, Ltd., Japan

[21] Appl. No.: 266,672

[22] Filed: Jun. 28, 1994

[30] Foreign Application Priority Data

Jun. 29, 1993 [JP] Japan .................................. 5-159476

[51] Int. Cl.$^6$ .................................................... B05C 1/06
[52] U.S. Cl. .................. 118/256; 118/323; 222/180; 222/222; 222/420; 222/505; 222/181.1
[58] Field of Search .................... 118/256, 323; 222/180, 181, 222, 420, 505

[56] References Cited

U.S. PATENT DOCUMENTS 5,012,758  5/1991  Kunzler .................................. 111/256

FOREIGN PATENT DOCUMENTS 1-40735  6/1972  Japan .

OTHER PUBLICATIONS

Electronic Packaging Technology, Aug. 1992, pp. 90–91.

Electronic Engineering, Jun. Separate vol. 1991, pp. 126 and 127.

Electronic Engineering, Dec. 1986, p. 103.

Primary Examiner—Timothy M. McMahon
Attorney, Agent, or Firm—Evenson, McKeown, Edwards & Lenahan

[57] ABSTRACT

A depositing apparatus includes a profile-following mechanism having a translational displacement mechanism portion and a rotation mechanism portion adapted to allow a head to be swung in the directions of both X and the Y axes so that the head follows a profile of the surface of workpiece smoothly around a first contact point, thereof with the workpiece, serving as a fulcrum point.

18 Claims, 19 Drawing Sheets

FIG. IIA
PRIOR ART
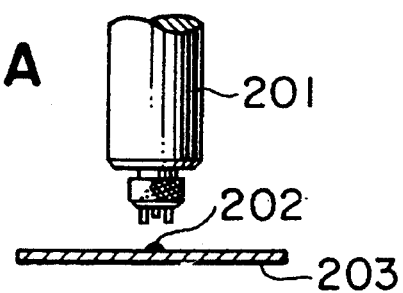
FIG. IIB
PRIOR ART
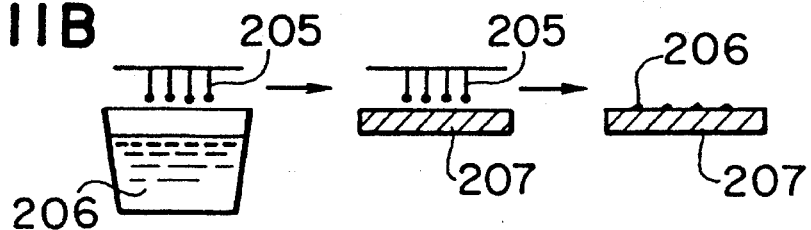
FIG. IIC
PRIOR ART
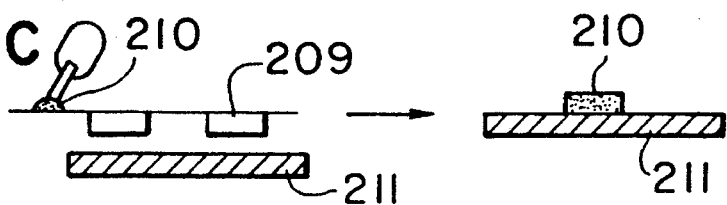
FIG. IID
PRIOR ART
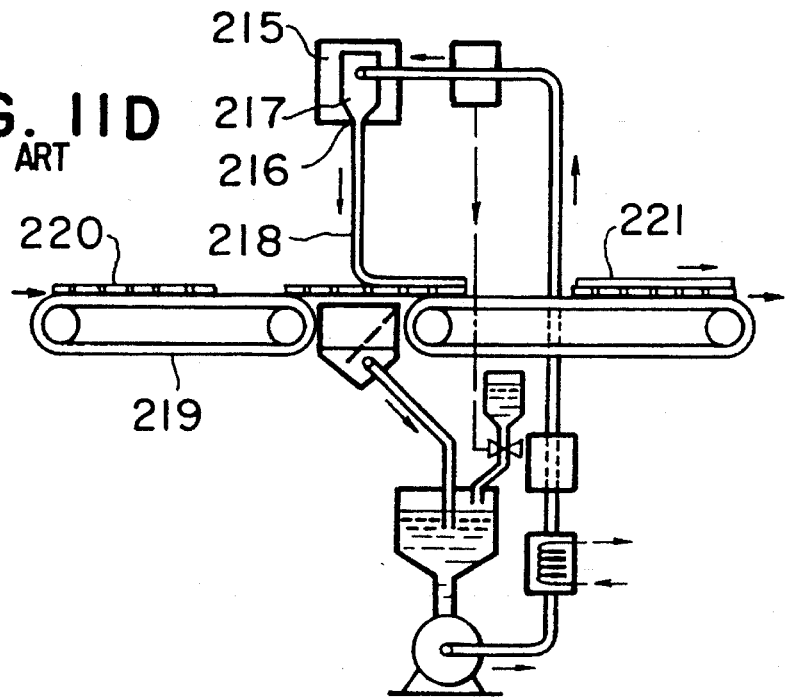

DEPOSITION APPARATUS AND PROFILE-FOLLOWING DEVICE SUITABLE FOR APPARATUSES SUCH AS THOSE FOR DEPOSITION

BACKGROUND OF THE INVENTION

The present invention relates to a deposition apparatus for spreading, in a uniform thickness, a highly viscous fluid over a wide area with, for example, a fluid deposition head and a profile-following mechanism or device suitable for the deposition apparatus, the apparatus including a workpiece-contacting portion which changes its posture while following workpiece contact.

RELATED ART

Conventionally, a method for soldering and packaging or surface-mounting chip components such as semiconductor devices comprises the steps of depositing a highly viscous fluid on parts of a substrate where the chip components are mounted to prevent chip components from moving, and soldering the chip components temporarily fixed at the respective deposition sites.

Methods for depositing highly viscous fluid at the component mounting site as a part of the packaging process include the dispensing process, pin transcription process, silkscreen printing process, spin-coating process, and curtain-coating process (e.g., "Adhesive for Chip Components" in a Japanese magazine "Electronic Packaging Technology, (published by Technology Research Center Corp., Ltd.)" August 1992, p. 90–91; and "Resist Deposition Apparatus (Curtain Coater/Solder Resist")" in a Japanese magazine "Electronic Engineering," (published by Business & Technology Daily News, Ltd.), June Separate Volume 1991, p. 126–127.

As shown in FIG. 11A, the dispensing process involves pouring fluid into a dispenser 201 having a small nozzle, applying pressure to the dispenser with air, extruding adhesive fluid from the tip of the nozzle, and depositing a fluid drop 202 on the substrate 203 (e.g., "Bonding Printed-circuit" described in a Japanese magazine "Electronic Engineering," (published by Business & Technology Daily News, Ltd.), December 1986, p. 103, and the component designated at 1 in FIG. 7).

As shown in FIG. 11B, the pin transcription process involves dipping ends of thin pins 205 in fluid 206 to apply the fluid 206 to the ends of the pins and depositing the fluid 206 on a surface of a substrate 207 by touching the substrate surface with the ends of the pins (designated at 2 in the above-mentioned FIG. 7). In this process, a deposited amount of fluid varies with the pin thickness 205, thereby making it difficult to accurately control the deposition amount.

As shown in FIG. 11C, the silkscreen printing process involves printing and depositing, at a predetermined site on a substrate 211, an adhesive with a screen stencil 209 having a predetermined pattern (designated at 3 in FIG. 7).

The spin-coating process provides a uniform fluid thickness of fluid by centrifugal force upon rotating a workpiece at high speed after supplying a specific amount of fluid to the workpiece.

As shown in FIG. 11D, the curtain-coating process forms a film 221 having a uniform thickness by continuously dropping, from a slit 216 of about 0.5 mm wide in a discharge portion 215, resistor fluid 217 in the form of a film (curtain) 218 and allowing a substrate 220 to pass through below the curtain by means of a belt 219 or the like at a fixed speed. This method is used, for example, in a Programmer 150C/CTV manufactured by Ciba-Geigi Co., Ltd. (The above-mentioned "Electronic Technology", June Separate volume 1991, p. 126–127).

However, a range or area or scope of deposition in one-time fluid deposition is not considered in any of the above prior arts. The above prior arts have draw-backs of a limited deposition area (at one point) in one-time deposition treatment, or of depositing the fluid only over the substantially entire surface of the workpiece. In other words, it was not possible to spread highly viscous fluid on the workpiece over the minimum required area, or to uniformly deposit fluid of a specific thickness in an arbitrary pattern.

A bonding apparatus for heating and pressure-bonding leads to an IC (Integrated Circuit) chip is known to include a profile-following mechanism having leaf springs (for example, Japanese Patent Unexamined Publication No. 1-140735).

Japanese Patent Unexamined Publication No. 1-140735 discloses, as shown in FIGS. 12A to 12D, a tape automated bonding (TAB) apparatus comprising a tool 309 for heating and pressure-bonding a pellet or an IC chip 301 arranged on an IC stage 304 and having bumps 303, with a tape 305 having leads 307 on a periphery of a square hole 306, wherein the tool 309 is supported via a profile-following mechanism having two pairs of leaf springs 314, 314 and 319, 319 so that the tool 309 can be moved following the surface profile of the IC chip for heating and pressure-bonding. Each of the leaf springs 319 are fixed at respective ends to an upper attachment block 321 and a joint block 316 with screws 323 and 322 so that imaginary extension lines of leaf springs 319 intersect at an angle of α2 at a distal end 315 of the bonding tool 309. Each of leaf springs 314 are fixed at respective ends to the joint block 316 and a tool-attachment block 312 with screws 318 and 317 so that imaginary extension lines of leaf springs 314 intersect at an angle of α1 at the distal end 315 of the bonding tool 309. The upper attachment block 321 is fixed to a base 320 of the profile-following mechanism while the bonding tool 309 providing the bonding surface 310 is fixed through a tool shaft 311 to the tool-attachment block 312 with a screw 313. Reference Numeral 325 designates a tape guide.

When there is a difference in heights of the bumps 303 mounted on an upper face 302 of the pellet 301 set on the fixed stage 304, a reaction force PF is generated if one side of the bonding face 310 of the tool 309 having been lowered in the direction of an arrow PC contacts a higher one of bumps. The tool 309 is tilted in the direction of an arrow PE, and the joint block 316 is tilted in the direction of the arrow PE via the tool-attachment block 312 and leaf springs 314. Accordingly, the leaf springs 319 are bent. When the tool 309 is further lowered in the direction PC, the other side of the bonding face 310 is brought into contact with a lower one of the bumps 303. Thus, profiling or profile-following is completed. During this operation, the lead 307 is not displaced from the bump and it is possible to follow the height of the bump.

However, Japanese Patent Unexamined Publication No. 1-140735 does not suggest a combination of a profile-following mechanism of this type with a tool other than a heating and pressure-bonding tool.

SUMMARY OF THE INVENTION

The present invention has been made in view of the above points. A first object; of the invention is to provide a deposition apparatus which can deposit, at one time, highly viscous fluid uniformly on a predetermined area of the surface of a workpiece.

In accordance with the present invention, the first object of the invention is attained by a deposition apparatus for depositing highly viscous fluid on a surface of a workpiece, the apparatus comprising:

a deposition head having a deposition surface at a distal end thereof;

a head-support means for supporting the deposition head at a first end thereof; and a head drive means connected to a second end of the head-support means to press the deposition surface of the deposition head against the surface of the workpiece;

the head-support means having a profile-following mechanism for swingably supporting the deposition head so that the head can be swung or rotated about one edge of the deposition surface of the deposition head serving as a fulcrum point until substantially an entire part of the deposition surface of the deposition head contacts the surface of the workpiece, when the head drive means applies a force, directed toward the surface of the workpiece, to the second end of the head-support means in a state where the edge contacts a part of a region of the surface of the workpiece where a droplet of highly viscous fluid is deposited.

In the deposition apparatus, when the head drive means applies force directed toward the surface of the workpiece to the second end of the head-support means in the state where an arbitrary edge of the deposition surface contacts a part of the region of the workpiece surface where the droplet of highly viscous fluid is deposited, the profile-following mechanism rotates or swings the deposition head about or around the contacting edge of the deposition surface of the deposition head serving as the fulcrum point, i.e. without allowing the contacting edge to be shifted or displaced with respect to an initially contacted part of the surface of the workpiece, until substantially the entire part of the deposition surface of the deposition head contacts the surface of the workpiece. Consequently, along with rotation of or swinging operation the deposition head, the deposition surface of the deposition head expands highly viscous fluid from a site or region near the initially contacted part of the surface of the workpiece or near the contacted edge of the deposition surface of the deposition head across the surface of the workpiece so that it is ensured the highly viscous fluid can be deposited on a predetermined area defined by the deposition surface of the deposition head. Furthermore, deposition continues until substantially the entire part of the deposition surface is pressed against the surface of the workpiece (via the expanded highly viscous fluid layer) so that it is ensured the highly viscous fluid can be uniformly deposited on the predetermined range defined by the deposition surface of the deposition head. Capability of the above-mentioned rotation or swinging operation means a positional relationship that an extension line of a vector of a force or a line of action of the force applied to the head in response to a force applied to the second end of the head-support mean is offset or deviated from the edge(s) or side end(s) of the deposition surface that is(are) likely to contact the surface of the workpiece and intersects the deposition surface of the deposition head.

The profile-following mechanism of the deposition apparatus performs the swinging operation around an arbitrary edge of the deposition surface of the deposition head so that pre-positioning of the deposition surface of the deposition head relative to the surface of the workpiece is not required to be made highly accurately. This facilitates the deposition operation by the deposition apparatus.

Consequently, when a fluid deposition head having on the deposition surface projections distributed in the form of mesh or lattice pattern and when the deposition surface presses the fluid on the workpiece, area of the contact of the head with workpiece substantially expands from the first contact point to portions more remote therefrom, while the head presses fluid progressively from one side (contact point) to the other side(s), and the surface of the workpiece and the deposition surface of the head are finally closely contacted. Thus, fluid can be gradually spread to all edges of the finally contacted region or area.

When the head is pressed against fluid and workpiece, bubbles in fluid are also pressed out, while the head is not shifted or slipped along the surface of the workpiece, thereby enabling highly accurate pressing and positioning. Moreover, because the deposition surface of the head is closely contacted with the surface of the workpiece, uniform pressure can be applied to the entire deposition surface. Therefore, the fluid can be uniformly spread over the entire area, of the surface of the workpiece, to be deposited with the fluid to provide a desired thickness of fluid layer or film where the thickness is determined by a depth of the recess between adjacent projections on the head deposition surface.

Thus, highly viscous fluid can be deposited at a fixed thickness at one time in chip component packaging or mounting.

Furthermore, when the head is detached or moved away from the surface of the workpiece, large number of projections formed on the deposition surface of the head facilitate easy separation of the deposition surface from the fluid on the surface of the workpiece. Thus, the head can be detached without affecting the liquid or fluid surface having been formed on the surface of the workpiece at a uniform thickness upon the pressing of the head against the workpiece. When the head is detached, a force to pull up the workpiece due to the high viscosity of the fluid liquid can be minimized by the projections on the deposition surface of the head. Thus, the head can be smoothly detached from the fluid surface on the workpiece.

In a deposition apparatus according to a preferred embodiment of the present invention, the head drive means is adapted to move the head-support means toward the surface of the workpiece so as to move the deposition head separate from the surface of the workpiece toward the surface of the workpiece until one edge of the deposition surface of the deposition head most closest to the surface of the workpiece among edges of the deposition surface of the deposition head contacts a part of the region of the workpiece where the droplet of highly viscous fluid is deposited. One edge of the deposition surface of the deposition head "closest to" the surface of the workpiece, herein is referred to as an edge of the deposition surface of the deposition head where a distance between the deposition surface of the deposition head and the surface of the workpiece is minimum in the direction in which the head drive means moves the head-support means. Preferably, the head is attached in such a manner that it is tilted with respect to the head-support means so that a specific edge constitutes the closest edge. Furthermore, the tilt angle is preferably adjustable. For example, the angle either equals or exceeds an angle at which the deposition surface of the head can be separated from fluid on the surface of the workpiece.

The profile-following mechanism of the above head preferably comprises:

a head attachment or head attachment portion holding the deposition head;

a first bearing stand supporting the head attachment rotatably around a first support rotation axis or shaft perpendicular to a Y axis;

a second bearing stand supporting the first bearing stand rotatably around a second support rotation axis or shaft in the direction of the Y axis;

a first translational displacement means engaged with the second bearing stand displaceably thereto in the direction of the Y axis;

a first bearing base engaged in pressing relation with the first translational displacement means in a direction of Z axis via a first elastic means, the first bearing base having a first guide or first guide portion for regulating an amount of displacement of the first displacement means in the direction of the Y axis with respect to the second bearing stand upon application and release of pressure directed toward the first displacement means;

a second translational displacement means engaged with the first bearing base displaceably thereto in a direction of X axis; and a second bearing base engaged in pressing relation with the second displacement means in the direction of the Z axis through a second elastic means, the second bearing base having a second guide for regulating an amount of displacement of the second displacement means in the direction of the X axis with respect to the first bearing base upon application and release of the pressure directed toward the second displacement means.

In this case, the adjustment of the first and second elastic means depending on the viscosity of fluid enables adjustment of the force applied to the surface of the workpiece through the deposition surface of the deposition head and uniform depositing of the fluid regardless of its viscosity. In addition, when the force applied by the head drive means is released, the deposition surface of the deposition head is rotated around the one edge thereof and is gradually separated from the workpiece in an order from a portion near an edge opposite to the above-mentioned one edge. Consequently, the deposition surface of the deposition head can be separated from the fluid layer or fluid film on the surface of the workpiece by a relatively small separation force. Therefore, when the deposition apparatus after having performed deposition is released from pressing, there is little fear that the workpiece will be raised with the head. Furthermore, the adjustment of the first and second elastic means enables the adjustment of pressure applied to the deposition surface.

Preferably, the first bearing base is adapted to transmit pressure directed toward the first displacement means to the first bearing stand via the first displacement means and the second bearing stand so as to rotate the first bearing stand around the first support rotation axis with respect to the deposition head so that the deposition surface of the deposition head follows a profile of the surface of the workpiece in the direction of the Y axis around the one edge of the deposition head serving as the fulcrum with respect to the workpiece, and so as to allow the first displacement means to be displaced in the direction of the Y axis with respect to the second bearing stand.

More preferably, the above second bearing base is adapted to transmit pressure directed toward the second displacement means to the second displacement means and the first bearing base so as to rotate the second bearing stand around the second support rotation axis with respect to the deposition head so that the deposition surface of the deposition head follows the profile of the surface of the workpiece in the direction of the X axis around the one edge of the deposition head serving as the fulcrum with respect to the workpiece, and so as to allow the second displacement means to be displaced in the direction of the X axis with respect to the first bearing base.

Additionally, preferably, the second bearing stand has a first engagement portion adapted to be engaged with the first guide of the first bearing base so that the amount of displacement of the first displacement means with respect to the second bearing stand in the direction of the Y axis is regulated upon application and release of the pressure directed toward the first displacement means.

Such construction allows, in cooperation with the first elastic means, application of appropriate force to the fulcrum upon the rotation of the deposition surface of the head and returning of the first displacement merit means to its initial position upon release of the pressure or force applied by the head drive means.

Preferably, the above first bearing base has a second engagement portion adapted to be engaged with the second guide of the second bearing base so that the amount of displacement of the second displacement means in the direction of the X axis with respect to the first bearing base is regulated upon application and release of the pressure directed toward the second displacement means.

Such construction allows, in cooperation with the second elastic means, application of appropriate force to the fulcrum upon the rotation of the deposition surface of the head, and returning of the second displacement means to the initial position upon the release of the pressure or force applied by the head drive means.

Further, preferably, the head attachment is adapted to hold the deposition head detachably. This enables to change or modify the deposition head according to a type of fluid and workpiece surface.

Further, preferably, the first displacement means comprises a first slide rail whereas the second displacement means comprises a second slide rail. At least one of the first and second displacement means may comprise, for example, a slide rod in place of the slide rail.

The profile-following mechanism which constitutes or forms a part of the deposition apparatus according to the preferred embodiment(s) of the present invention can be used advantageously in apparatuses for work other than deposition of fluid. Therefore, a second object of the present invention is to provide a profile-following device having a tool capable of being entirely contacted with a predetermined area or range of the workpiece surface, substantially irrespective of the tilt direction and angle with respect to the surface of the workpiece.

In accordance with the present invention, the second object of the present invention can be attained by a profile-following device comprising:

a head having a tool surface portion for performing a predetermined operation with respect to a workpiece;

a head attachment holding the head;

a first bearing stand supporting the first bearing stand rotatably around a first support rotation axis perpendicular to a Y axis;

a second bearing stand supporting the first bearing stand rotatably around a second support rotation axis in the direction of the Y axis;

a first translational displacement means engaged with the second bearing stand displaceably thereto in the direction of the Y axis;

a first bearing base engaged in pressing relation with the first displacement means via a first elastic means in a direction of Z axis, the first bearing base having a first guide or first guide portion for regulating an amount of displacement of the first displacement means in the direction of the Y axis with respect to the second bearing stand upon application and release of pressure directed toward the first displacement means;

a second translational displacement means engaged with the first bearing base displaceably thereto in a direction of X axis; and a second bearing base engaged in pressing relation with the second displacement means via a second elastic means in the direction of the Z axis, the second bearing base having a second guide for regulating an amount of displacement of the second displacement means with respect to the first bearing base in the direction of the X axis upon application and release of pressure directed toward the second displacement means;

wherein a line of action of a force applied to the head in response to the pressure applied to the second bearing base is offset from a first contact point, of the tool surface of the head, to be contacted first with the workpiece and intersects the tool surface of the head.

Because the profile-following device comprises the thus constructed first and second bearing stand, first and second translational displacement means, and first and second bearing base, the line of action of the force applied to the head in response to the pressure applied to the second bearing base being offset from the first contact point, upon application of pressure directed toward the workpiece to the second bearing base, the first contact point of the tool surface either abuts or contacts a contacted or deposited surface of the workpiece. Thereafter, the head of the profile-following device is swung around the first contact point serving as the fulcrum, namely without shift of the contact point with respect to and along the contacted surface of the workpiece, so that substantially the entire portion of the tool surface is allowed to contact the contact surface of the workpiece. Thus, there is little fear that dust or the like is generated between the head and the workpiece, because there is nothing more than a certain degree of rolling friction therebetween. In a case where a plurality of points may have a chance of becoming the first contact point, the first contact point is determined depending on conditions such as the direction of the profile-following device with respect to the contact surface of the workpiece. The first contact point is usually one of the edges of the tool surface. Preferably, the head is attached, in a tilted state, to the first bearing stand so that the specific edge of the tool surface always constitutes or becomes the first contact point. The tilted surface can be preferably adjusted.

In the above profile-following device, pressure applied to the second bearing base in the direction of the contact surface of the workpiece is transmitted to the second displacement means and the first bearing base.

The pressure transmitted to the first bearing base is further transmitted to the first bearing stand via the first displacement means and the second bearing stand. Then, the tool surface of the head is rotated in the direction of or toward Y axis around the first support rotation axis of the first bearing stand with the first contact point of the head serving as the fulcrum.

In the same manner, when pressure is transmitted to the second displacement means, the tool surface of the head rotates to follow the profile of the surface of the workpiece in the direction of or toward the X axis around the second support rotation axis of the second bearing stand with the first contact point of the head serving as the fulcrum.

When pressure is released from the second bearing base, the tool surface of the head is rotated in the directions of the X and Y axes with the first contact point serving as the fulcrum in the reverse manner, thereby separating from the workpiece.

In a profile-following device according to a preferred embodiment of the invention, the first bearing base is adapted to transmit pressure directed toward the first displacement means to the first bearing stand via the first displacement means and the second bearing stand so as to rotate the first bearing stand around the first support rotation axis with respect to the head so that tool surface of the head follows a profile of a contacted surface of the workpiece in the direction of the Y axis around the first contact point of the tool surface of the head, and so as to allow the first displacement means to be displaced in the direction of the Y axis with respect to the second bearing stand.

More preferably, the second bearing base is adapted to transmit pressure directed toward the second displacement means to the first bearing stand through the second displacement means and the first bearing base so as to rotate the second bearing stand with respect to the head around the second support rotation axis so that the tool surface of the head follows the profile of the contacted surface of the workpiece in the direction of the X axis around the first contact point of the tool surface, and so as to allow the second displacement means to be displaced in the direction of the X axis with respect to the first bearing base.

Further, preferably, the second bearing stand has a first engagement portion engaged with the first guide of the first bearing base so that the amount of displacement of the first displacement means in the direction of the Y axis with respect to the second bearing stand is regulated upon application and release of the pressure directed toward the first displacement means.

More preferably, the first guide comprises a generally L-shaped extension having a slope engaged with the first engagement portion, and the first engagement portion comprises a roller capable of rolling on the slope.

Preferably, the first bearing base has a second engagement portion engaged with the second guide of the second bearing base so that the amount of displacement of the second displacement means in the direction of the X axis with respect to the first bearing base is regulated upon application and release of the pressure directed toward the second displacement means.

More preferably, the second guide comprises a generally L-shaped extension having a V-shaped guide surface engaged with the second engagement portion, and the second engagement portion comprises a roller capable of rolling on the V-shaped guide surface.

Preferably, the head is a deposition head for depositing highly viscous fluid on the contacted surface of the workpiece and the tool surface portion comprises a deposition surface of the deposition head, or the head is a clamping head for clamping, grasping or holding the workpiece and the tool surface portion comprises a clamp for clamping, grasping or holding the workpiece. The head may be constituted so as to mount the clamped workpiece or article on a separate device. More generally, the head may comprise a tool attached to an end of arms of a robot or manipulator such as program-controlled manipulator which performs other work.

Preferably, the head attachment is adapted to hold or support the head detachably. In this case, mere replacement of the head enables the profile-following apparatus to perform other desired work. The profile-following device substantially functions as a robot or manipulator with the tool. Besides, it is possible to have a structure for replacing the head in a one-touch operation.

Preferably, the first displacement means comprises a first slide rail whereas the second displacement means comprises a second slide rail.

BRIEF DESCRIPTION OF THE DRAWINGS

The foregoing and other objects, features, and advantages of the invention will become more apparent from the following description of preferred embodiments with reference to the attached drawings:

FIGS. 11A to 11D are views showing conventional deposition processes and devices.

DESCRIPTION OF THE PREFERRED EMBODIMENTS

Referring to FIGS. 1 to 8B, there is described a deposition apparatus having a profile-following mechanism according to an embodiment of the present invention.

Figure 1:
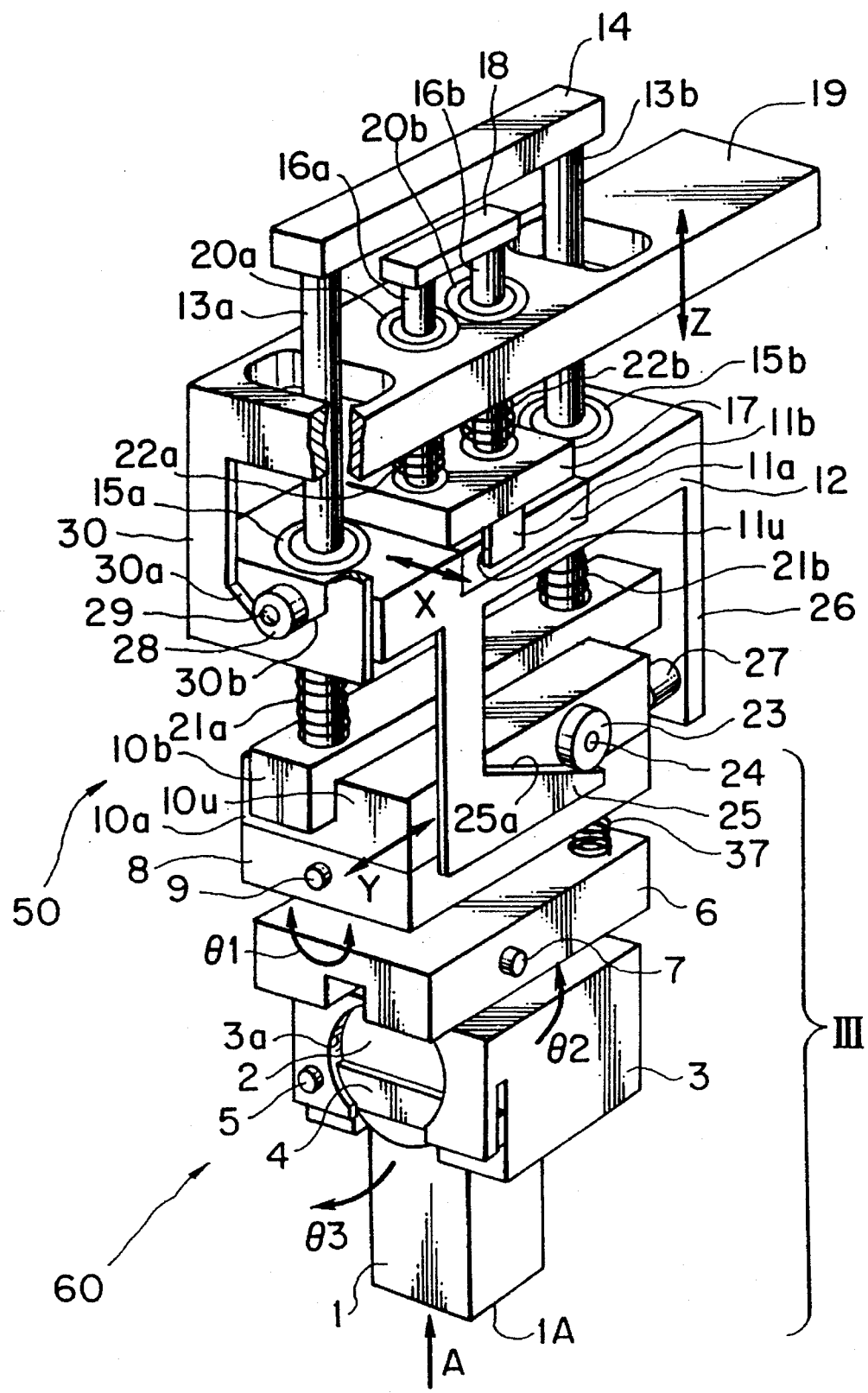
FIG. 1 is a perspective view showing one embodiment of the present invention.

FIG. 1 is a perspective view showing a profile-following mechanism according to one embodiment.

Figure 2A:
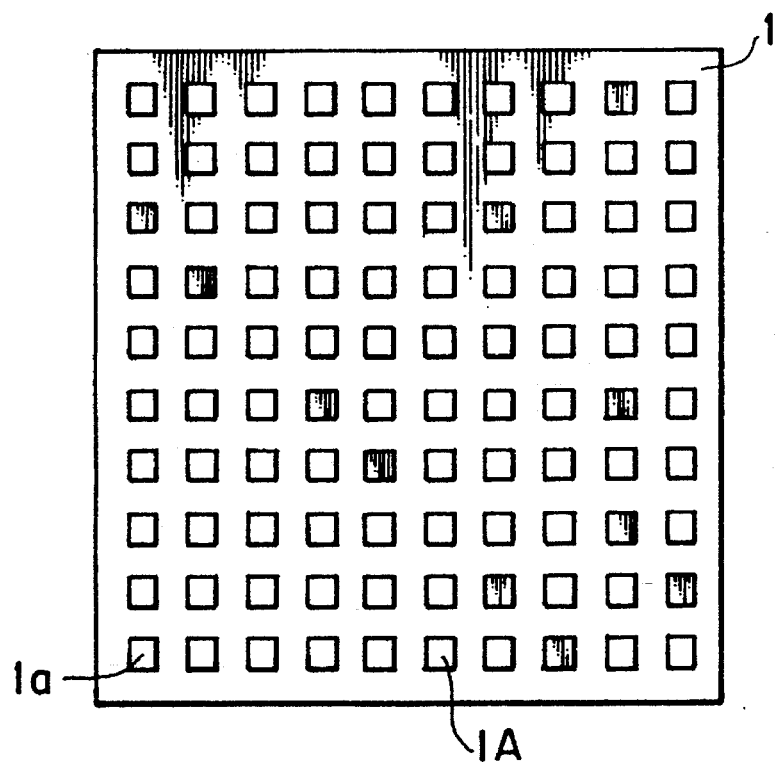
FIGS. 2A and 2B are a front view and a partial side view of a deposition surface of the fluid deposition head.
Figure 2B:
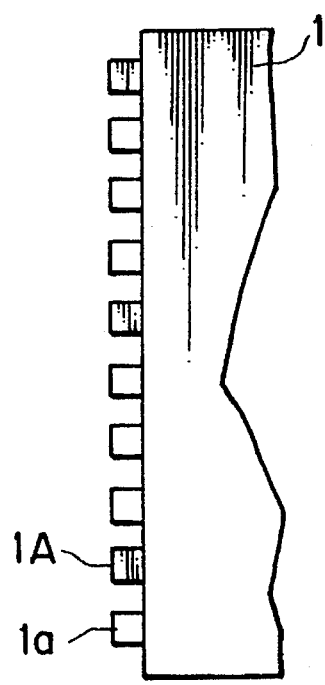

Referring to FIG. 1, reference numeral 1 designates a fluid deposition head for spreading or expanding highly viscous fluid on a workpiece. On a side of the head 1 in the direction of arrow A in FIG. 1, a deposition surface 1A is formed as a tool surface. "Highly viscous fluid" means herein a fluid having a degree of viscosity such that, even when a droplet of the fluid is placed on a surface of the workpiece to be deposited, the droplet does not spread thereon. The fluid may be a liquid with suspended fine particles in place of a simple liquid without solid matters. On the deposition surface 1A, as shown in FIGS. 2A and 2B, a plurality of projections 1a are formed in a mesh-like or lattice-like configuration. The projections 1a on the deposition surface may be distributed in different pattern as in random distribution. Further, projections having two or more configurations or shapes and/or dimensions may be present.

A head holder 2 is integrated with the head 1, and a holder case 3 serving as a head attachment or mounting portion receives and supports the head holder 2. Reference Numeral 4 designates a handle for positioning and fixing the head holder 2 in the holder case 3. As will be described later in relation to FIGS. 3A to 3D, an attachment or mounting port 3a for the head holder 2 in the holder case 3 is opened by rotating the handle 4 around a handle axis 5 serving as a pivot axis in the direction of $\theta_3$ shown in FIG. 1 to enable the detachment of the head holder 2 therethrough.

Reference Numeral 6 designates a first bearing stand. As will be described later in relation to FIGS. 3A to 3D, a first bearing stand 6 is combined or connected with the holder case 3 through a support rotation axis or shaft 7. The holder case 3 is adapted to be rotated in the direction of $\theta_2$ with respect to the first bearing stand 6. Along with this, the head 1 is also constituted to be rotated in the direction of $\theta_2$.

Reference Numeral 8 designates a second bearing stand. As will be described later in relation to FIGS. 3A to 3D, the second bearing stand 8 is combined or connected with the first bearing stand 6 through a support rotation axis or shaft 9. In this a case, the second bearing stand 8 is rotatably or pivotally connected to the first bearing stand 6 via the support rotation axis 9 extending in a direction perpendicular to the support rotation axis 7. Thus, the holder case 3 is rotatable together with the first bearing stand 6 in a direction of $\theta_1$ with respect to the second bearing stand 8 shown in FIG. 1.

A first block 10a is fixed onto the second bearing stand 8 and supports a slide rail 10b as a first translation means that is translationally displaced in a direction of Y in FIG. 1 in a recess or groove 10g formed in the central part of an upper portion thereof. Consequently, the second bearing stand 8 and the first block 10a as a whole constitute a second bearing stand assembly.

A second block 11a is fixed onto a first bearing stand 12 and supports a slide rail 11b as a second translation means that is translationally displaced in a direction of X in FIG. 1 in a recess or groove 11g formed in the central part of an upper portion thereof. Consequently, the first bearing stand 12 and the second block 11a as a whole constitute a first bearing stand assembly.

Reference characters 13a and 13b designate guide shafts each having a lower end fixed to the first slide rail 10b and an upper end fixed to a holding block 14, the guide shafts 13a and 13b penetrating through a linear bushings 15a and 15b provided in the first bearing base 12. The first bearing base 12 can be smoothly moved along the guide shaft 13a and 13b in a direction of Z shown in FIG. 1.

Reference characters 16a and 16b designate guide shafts each having a lower end fixed to a holding block 17 and an upper end fixed to a holding block 18, the guide shafts 16a and 16b penetrating through a linear bushings 20a and 20b provided in a second bearing base 19. In this case, on a lower face of the holding block 17, the slide rail 11b is fixed. The second bearing base 19 can be moved smoothly in the direction of Z shown in FIG. 1 along the guide shaft 16a and 16b.

Reference characters 21a and 21b designate compression springs serving as a first elastic means for biasing or pressing the first bearing base 12 in the direction of Z to enable the profile-following operation in the direction of Y shown in FIG. 1, 22a and 22b compression springs as a second elastic means for biasing or pressing the second bearing base 19 upward to enable the profile-following operation in the direction of X shown in FIG. 1. Adjustment of the force of the pair of springs 21a, 21b, 22a, 22b allows adjustment of pressure required for adhesive deposition. These springs can be replaced by any other elastic means that can function in the same way as these springs. For example, an expansion spring may be used in place of the compression spring to pull up the upper surface of the associated bearing base. In place of a coil spring, other type of spring or elastic member may be used.

A roller or bearing 23 serving as a first engagement portion is mounted on the block 10a by a screw or a pin 24 rotatably therearound, the bearing 23 being engaged with a generally L-shaped tapered guide 25 formed downwards from one side end, in the direction of X, of the bearing base 12. A tilted angle of the tapered or tilted guide surface 25a of the guide 25 may be made adjustable.

In this case, on a lower end portion of an extension 26 formed downwardly from a longitudinal end of the first bearing base 12, a positioning stop or stopper 27 of a predetermined length in the direction of Y is implanted to define an initial position of the first bearing base 12 in the direction of Y with respect to the second bearing stand 8.

A roller or bearing 24 serving as a second engagement portion is mounted on the bearing base 19 by a screw or a pin 29 rotatably therearound, the bearing 24 being engaged with a generally L-shaped tapered guide 30 formed downwardly from one end, in the direction of Y, of the bearing base 19. Tilted angles of tapered or tilted guide surfaces 30a and 30b of the guide 30 forming a V-shaped groove may be made adjustable.

These bearings 23 and 28, tapered guides 25 and 30, and positioning stopper 27 ensure to enable the-fluid deposition head 1 to be swung so that the deposition surface 1A of the head 1 becomes in one-side contact with the workpiece when the head 1 is pulled up after profile-following thereof with respect to the workpiece and to return on restore the head 1 and the thus constructed profile-following mechanism to their initial positions.

Figure 3A:
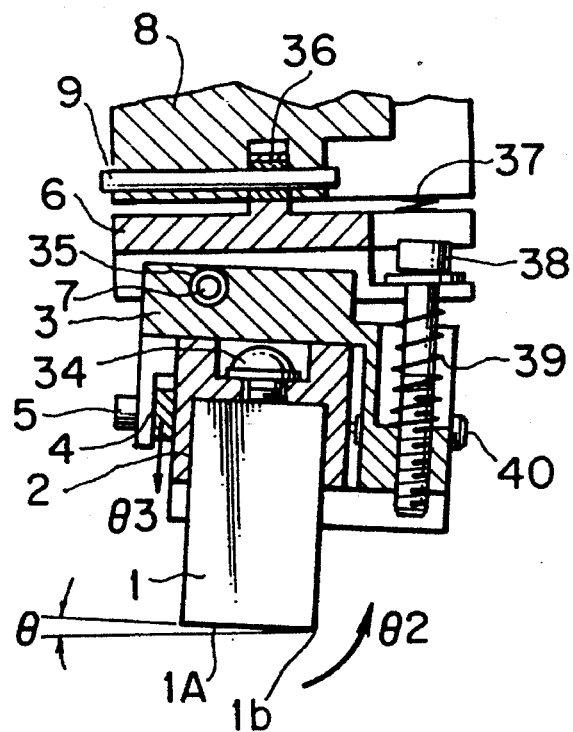
FIGS. 3A to 3D are sectional views showing a process for detaching the head.
Figure 3B:
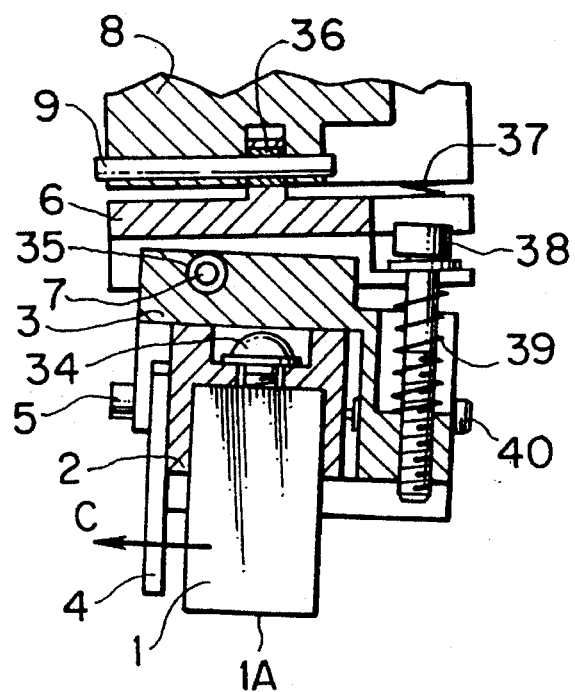
Figure 3C:
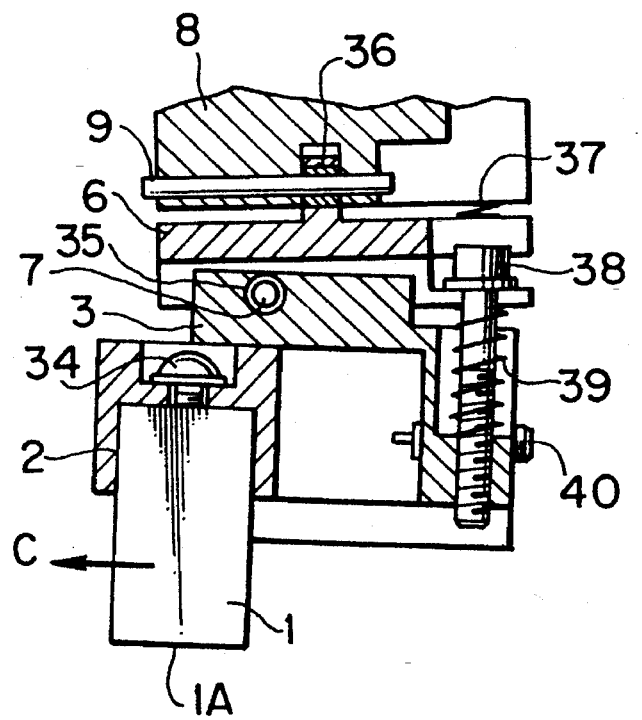
Figure 3D:
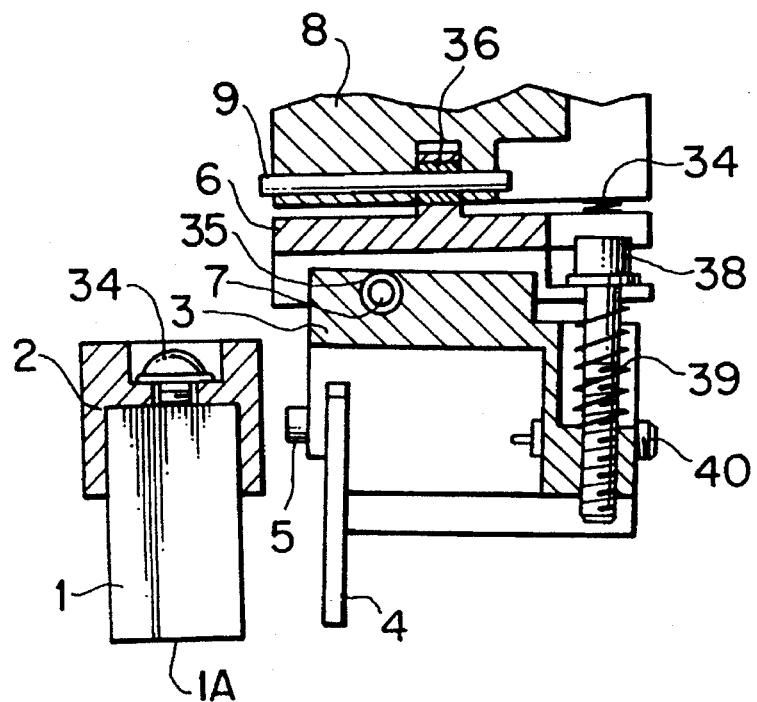

FIGS. 3A to 3D are sectional views of portion III of FIG. 1 for showing a process for detaching a fluid deposition head 1. When the head 1 is to be removed or detached, the handle 4 is rotated in the direction of $\theta_3$ in FIG. 3A to open the attachment port 3a (see FIG. 1) at the outset, and the head 1 is pulled in the direction of C as shown in FIGS. 3B and 3C with the result that the head 1 is pulled out together with the head holder 2 fixed thereto through the screw 34 (FIG. 3D).

Further, the head 1 is attached in an operation reversing the above operation.

The head holder 2 has an attachment or mounting portion having a cylindrical configuration. A space between the holder 2 and the holder case 3 is defined in the tolerance dimension of clearance fit so that no rattling is generated between the holder 2 and the holder case 3. When the head holder 2 is mounted to the case 3, the head holder 2 is pressed with a fixed pressure against the handle 4 and the holder 2 by a plunger 40 set in the holder case 3 and held in position. These structures facilitate the positioning and fixing of the head 1.

The fluid deposition head 1 is contacted with the workpiece at one side of the head 1 when detached from the workpiece. The surface 1A to be contacted with the workpiece is tilted at a required angle (FIG. 3A) in advance or beforehand. More specifically, the head 1 is tilted together with the holder case 3 through an angle adjustment bolt 38 with respect to the first bearing stand 6 and held by a pressuring spring 39, where a force of the pressuring spring 39 provides a force for pressing the workpiece when the deposition surface 1A of the fluid deposition head 1 contacts the workpiece at one side thereof upon detachment from the workpiece, a portion 1b constituting a tip contact point or line. The tip contact point or line 1b corresponds to an end of an edge or the edge per se, of the deposition surface 1A, closest to the surface of the workpiece.

In FIGS. 3A to 3D, reference numeral 35 designates a bearing provided for allowing the holder case 3 to rotate in the direction of $\theta_2$ smoothly on the support rotation axis or shaft 7. Similarly, reference numeral 36 designates a bearing provided for allowing the holder case 3 to rotate in the direction of $\theta_1$ on the support rotation axis or shaft 9. Reference Numeral 37 designates a pressing spring for holding the holder case 3 approximately horizontal (namely, so the deposition surface 1A is tilted by the angle θ).

Figure 4A:
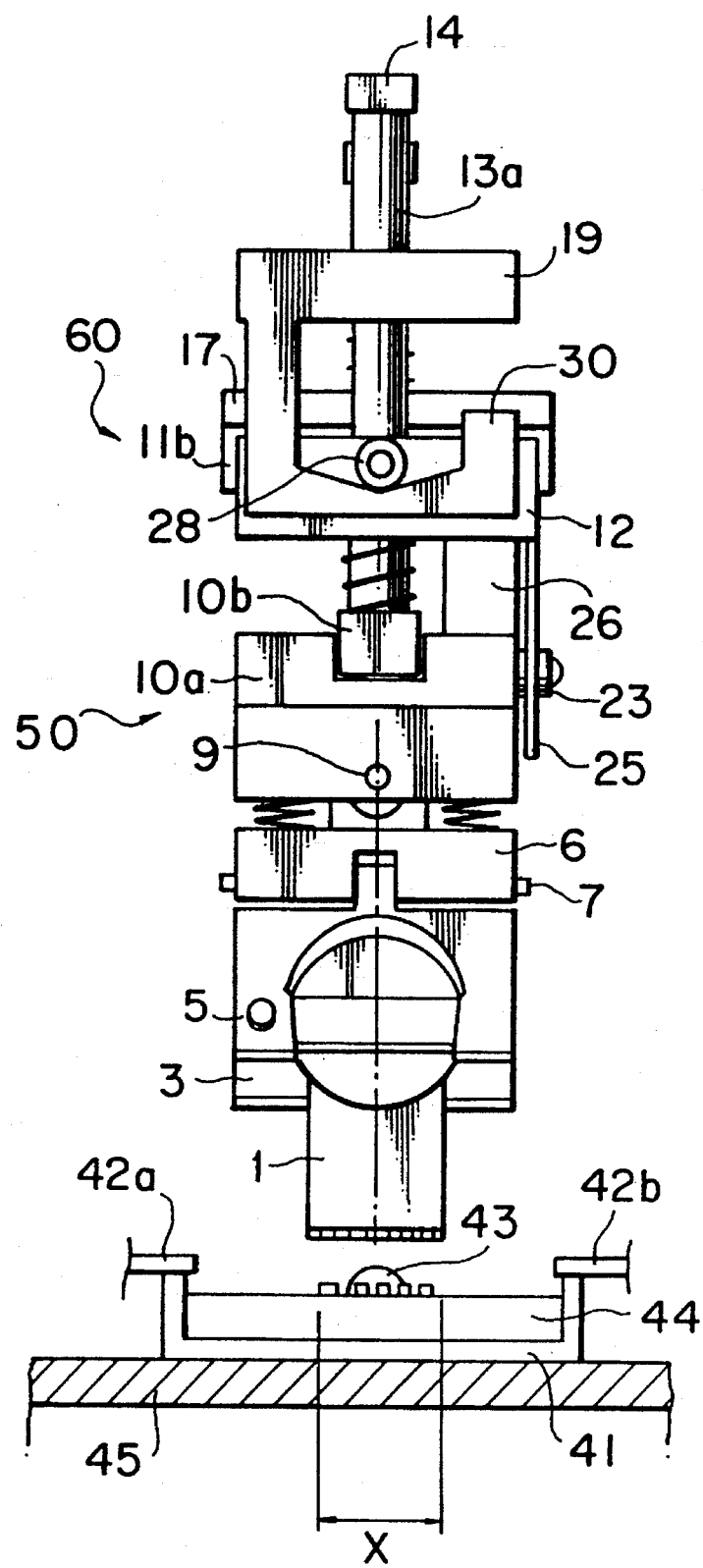
FIGS. 4A and 4B are a front view and a side view showing a first stage in profile-following.

FIGS. 4A and B to 6A and B are views showing the operation sequence when the head 1 is operated to deposit and spread the fluid on the workpiece. FIGS. 7A, 7B, 8A and 8B are views showing the operation sequence when the head 1 is detached from the workpiece.

Now, referring to these Figures, operation of a deposition apparatus 60 having a thus constructed profile-following mechanism 50 is described.

In FIGS. 4A and B, reference numeral 44 designates a substrate on which electronic components are mounted, 41 a dedicated carrier for setting the substrate 44. A transfer mechanism 45 transfers the carrier 44 to a predetermined site to be fixed by clamp jaws 42a, 42b. Since the jaws 42a and 42b should not contact the surface of the substrate 44, they hold the carrier 41.

In the deposition apparatus 60, the angle adjustment bolt 38 is adjusted so that the deposition surface 1A is tilted by the predetermined angle θ with respect to the surface of the substrate 44.

The substrate 44 may be set so that the substrate 44 is tilted by a predetermined angle with respect to the carrier 41.

An area or range or scope, designated by "x", of the substrate 44 set in this manner is the area to be subjected to one deposition. A specific amount of deposition fluid 43 is supplied through a dispenser (not shown) to the required site.

When deposition fluid 43 is supplied, a XY table 61 to which the second bearing base 19 is connected moves the profile-following mechanism 50 in this embodiment just above the droplet of deposition fluid 43. Between the second bearing base 19 and the XY table 61, a head drive mechanism 62 is provided to move the bearing base 19 vertically, i.e. in the Z direction. Thus, an action of the head drive mechanism 62 lowers the bearing base 19.

More specifically, the bearing base 19 is fixed with respect to a vertical shaft 63 of the drive mechanism 62. Consequently, a downward force F is applied to the bearing base 19 in the direction of the substrate 44.

Figure 4B:
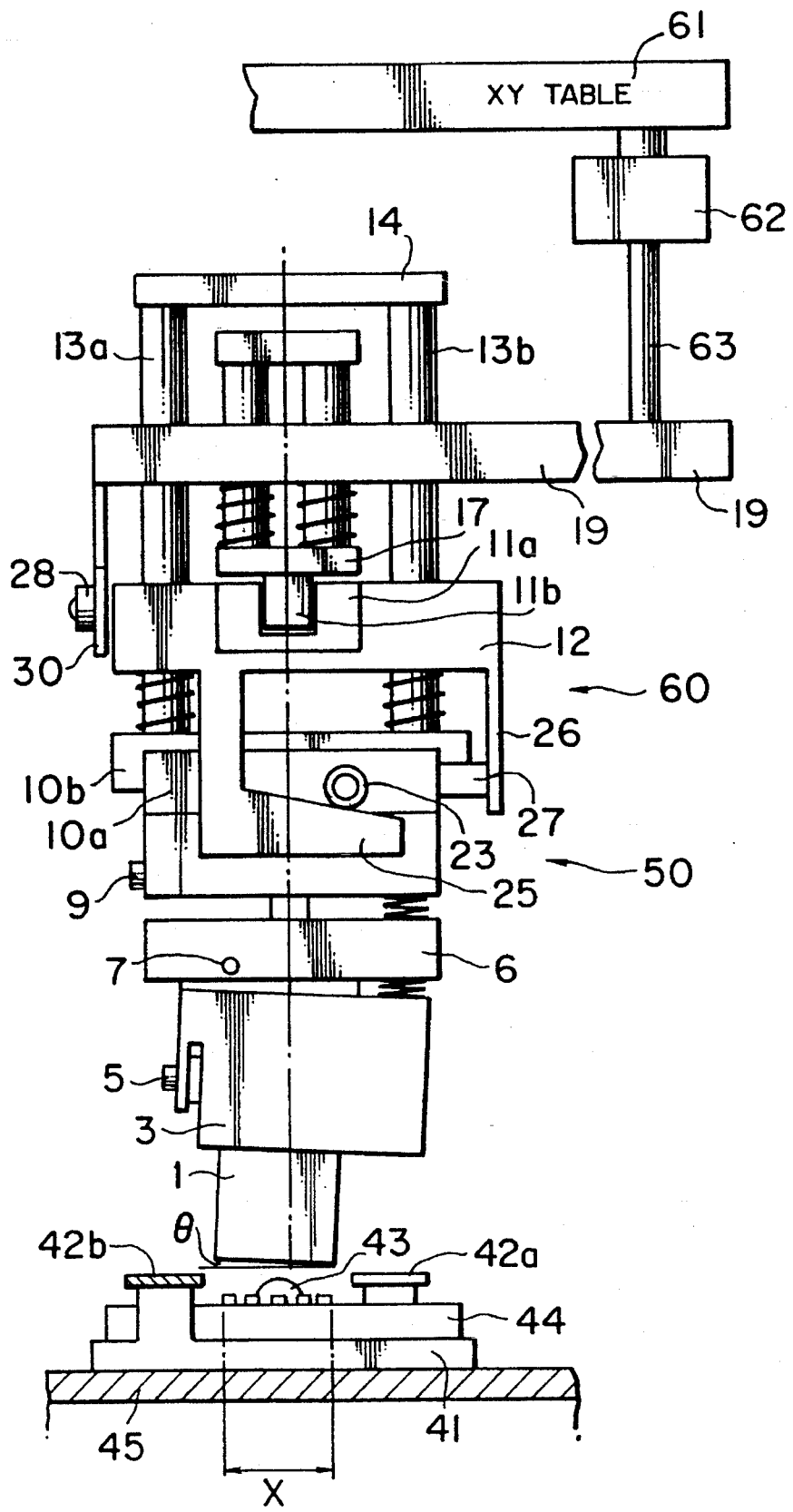

As described above, in the profile-following mechanism 50 the fluid deposition head 1 mounted to the holder case 3 as shown in FIG. 3A is tilted beforehand as shown in FIG. 4B.

Figure 5A:
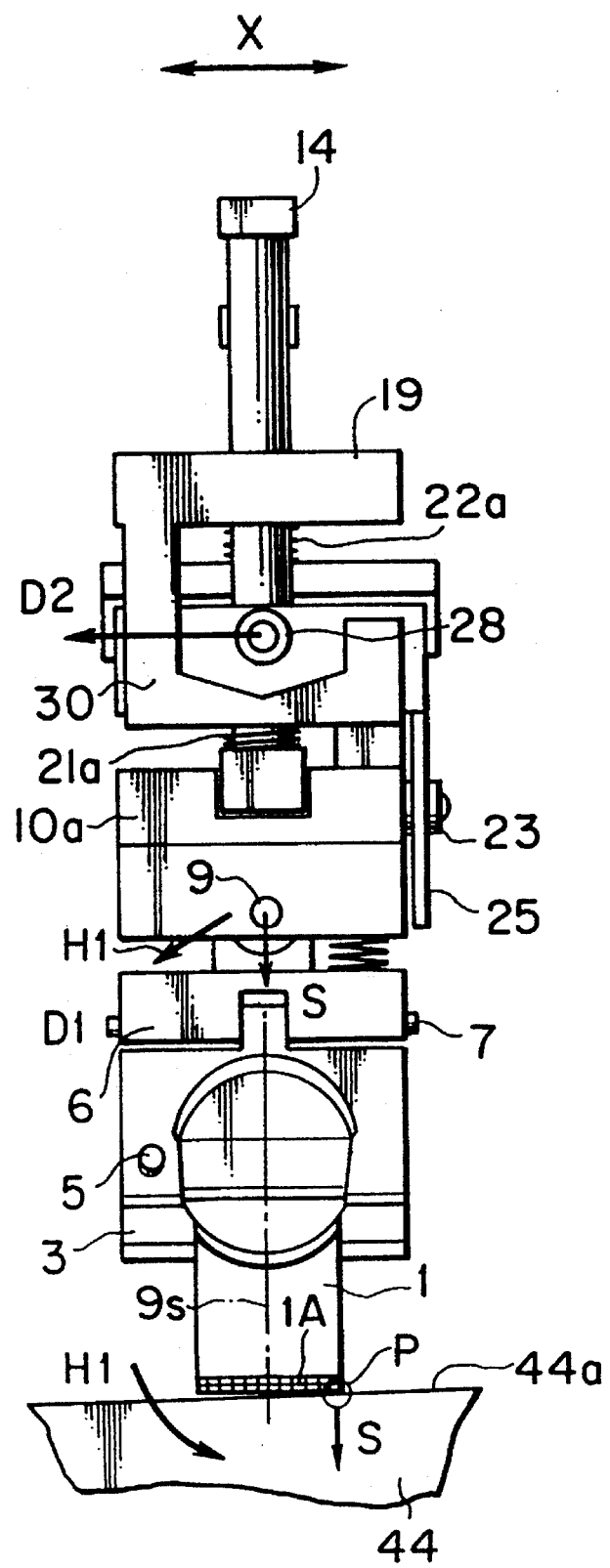
FIGS. 5A and 5B are a front view and a side view showing a second stage in profile-following.

Referring to FIGS. 5A and B, when one point 1b of the fluid deposition head 1 mounted to the profile-following mechanism 50 is lowered to contact the substrate 44 and is further lowered, the tapered guide 25 having held or fixed the block 10a via the bearing 23 and the tapered guide 30 having fixed the block 11a via the bearing 28 are simultaneously disengaged or detached from the associated bearings 23 and 28, thereby enabling the head 1 to start profile-following operation, with respect to the fluid deposited surface 44a of the substrate 44, in the direction of X and Y.

Furthermore, when the bearing base 19 is further lowered, a force S of springs 21a, 21b, 22a, and 22b is applied to the contact point P to the substrate 44, i.e. the above-mentioned one point 1b of the head 1, and to the support rotation axes or shafts 9 and 7.

The forces S applied to the support rotation axes 9 and 7 serve to give torques, respectively in the direction of H1 and H2 around the contact point P as the fulcrum point, to axes 9 and 7 and accordingly to the profile-following mechanism 50.

Lines 9S and 7S of action of the forces S applied to the rotation axes 9 and 7 in response to the force F applied to the second bearing base 19 by the head drive mechanism 62 intersect the deposition surface 1A of the head 1.

Figure 5B:
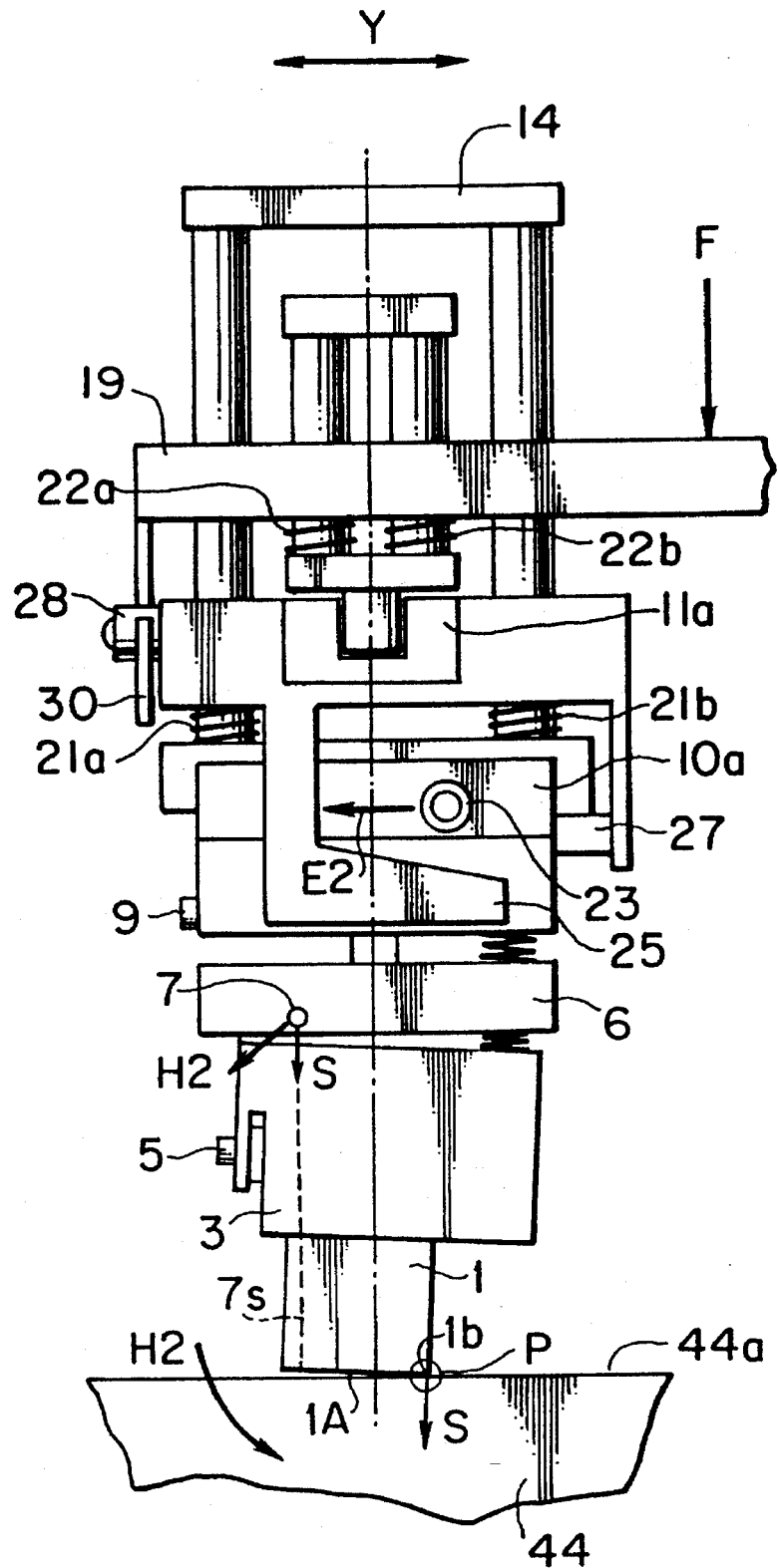

The deposition head 1 which receives the torque in the direction of the arrow H1 is tilted in the direction of the arrow H1 in FIG. 5A together with the holder case 3 and the bearing stand 6, and the fluid deposition head 1 which receives the torque in the direction of the arrow H2 is tilted in the direction of the arrow H2 in FIG. 5B together with the holder case 3. A rotational force in the direction of H1 around the point P is applied also to the block 11a and the bearing base 12. Further, a rotational force in the direction H2 around the point P is applied also to the block 10b and the second bearing base 8. Thus, the block 11a (and the bearing base 12) and the block 10a (and the second bearing stand 8) are moved horizontally in a direction D2 (E2) corresponding to the respective rotational direction.

Figure 6A:
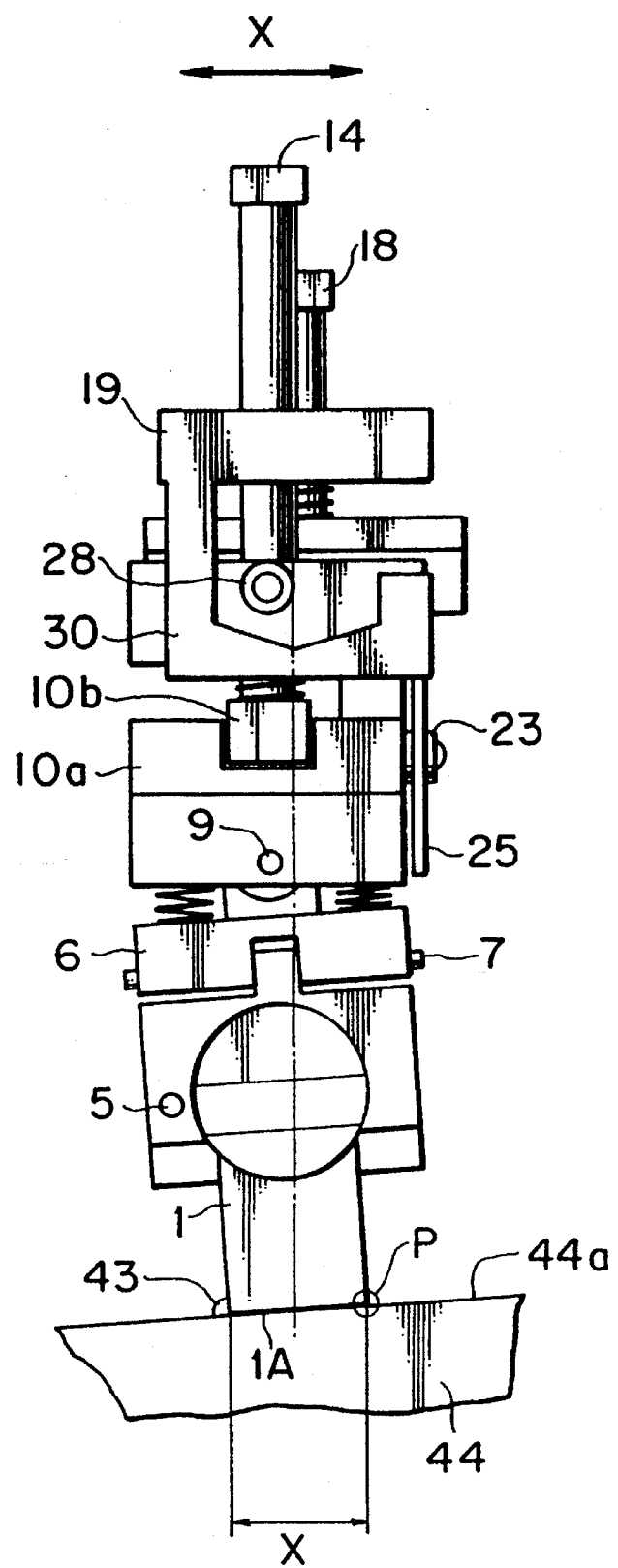
FIGS. 6A and 6B are a front view and a side view showing a third stage in profile-following.
Figure 6B:
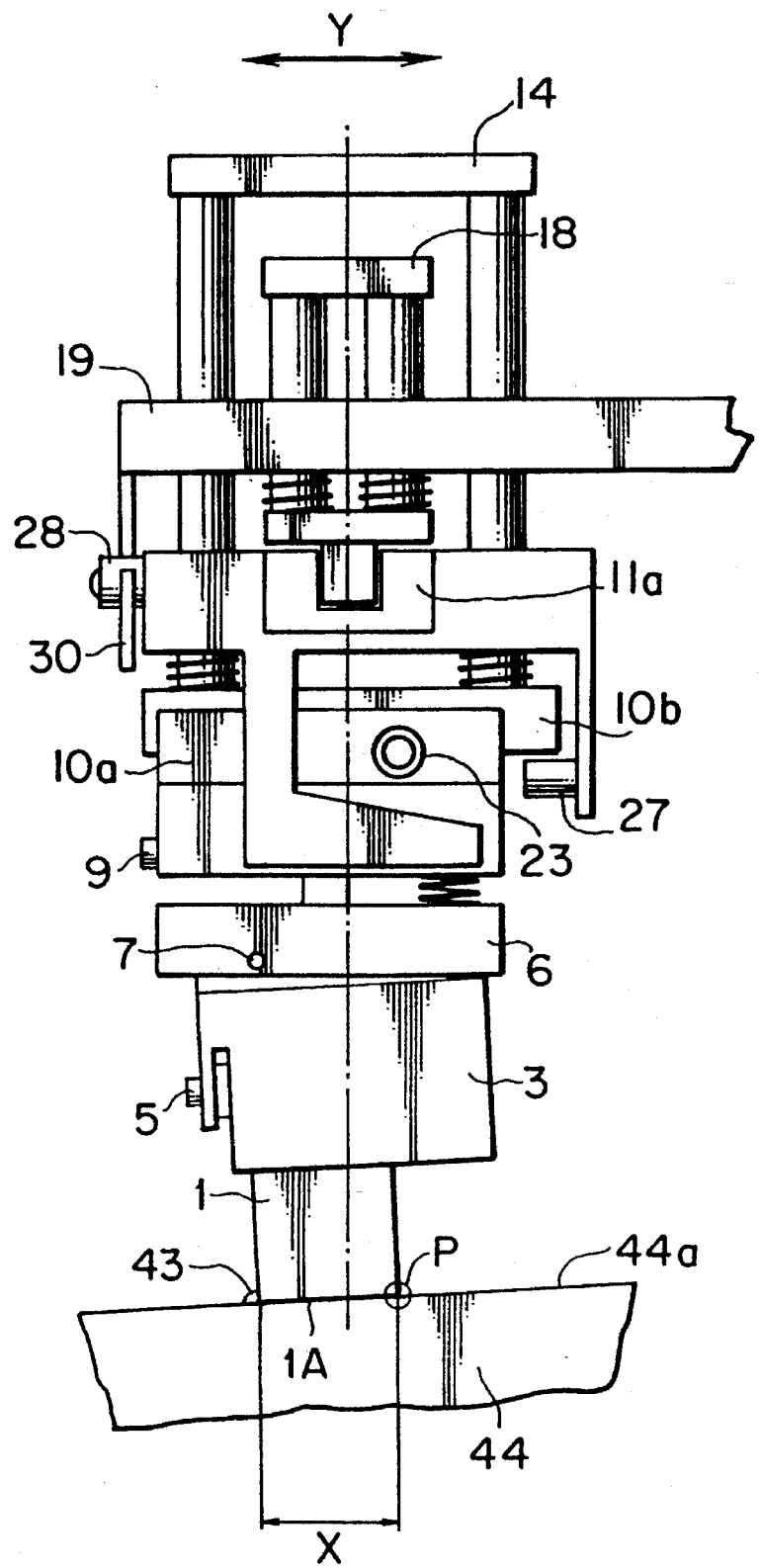

When rotational motions and horizontal translations in the direction of X and Y are performed simultaneously, profile-following of the fluid deposition head 1 is performed and completed without the shift or displacement of the contact point P with respect to the surface of the substrate 44, even when the substrate 44 per se is tilted or inclined to some extent as shown in FIGS. 6A and B.

In this state, the bearing base 19 is further lowered to apply a required spring pressure to the deposition surface 1A of the head 1.

Figure 6C:
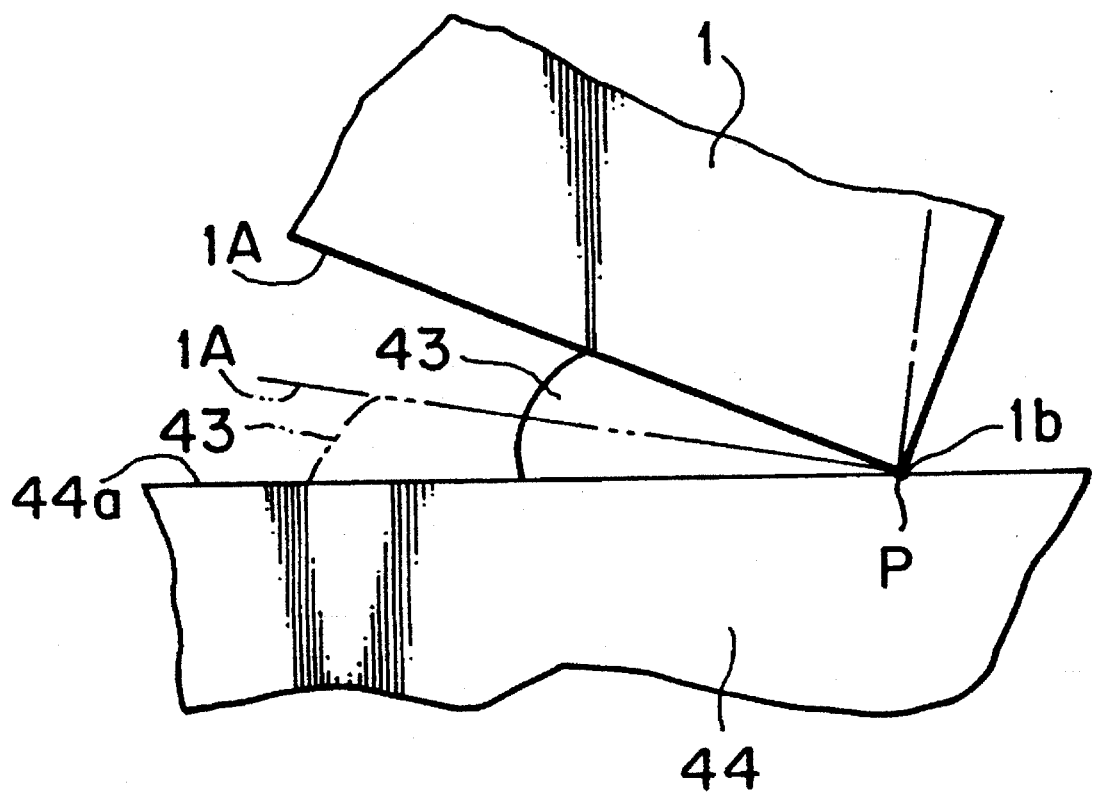
FIG. 6C is a view showing push-spread operation of adhesive liquid by the deposition surface.
Figure 7A:
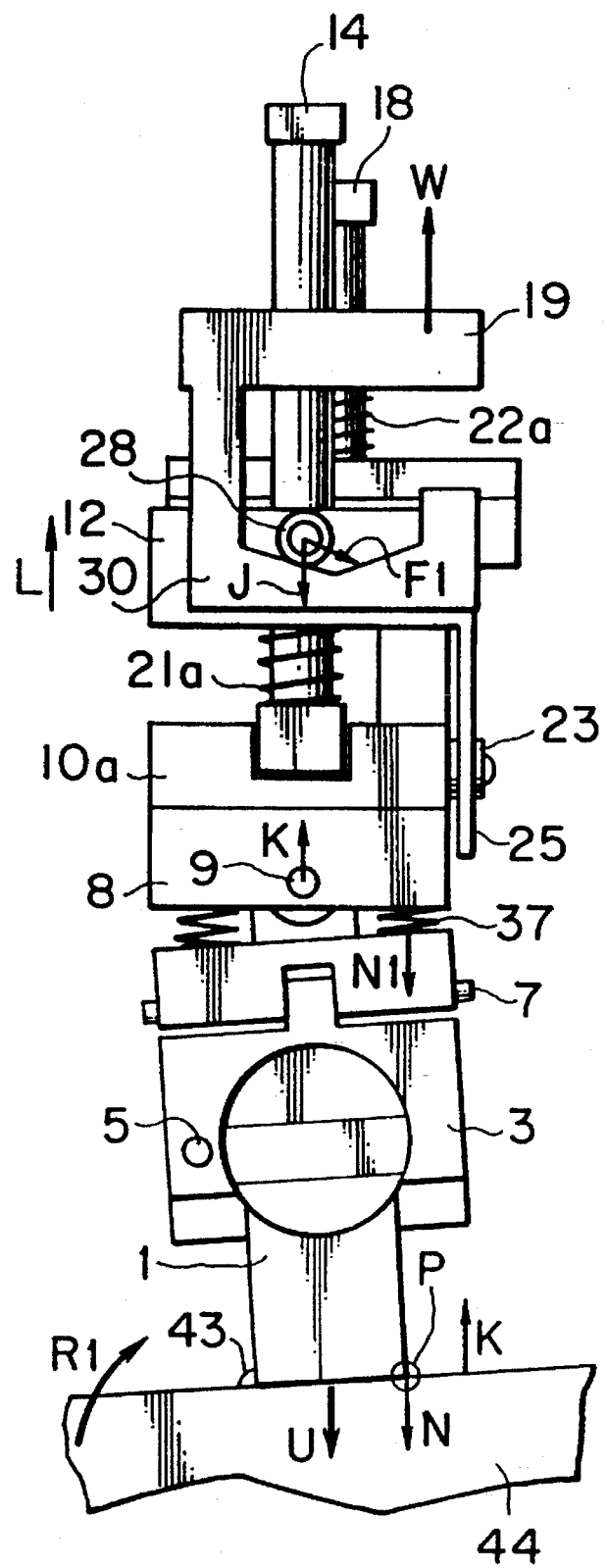
FIGS. 7A and 7B are a front view and a side view showing the first stage in head pull-up.
Figure 7B:
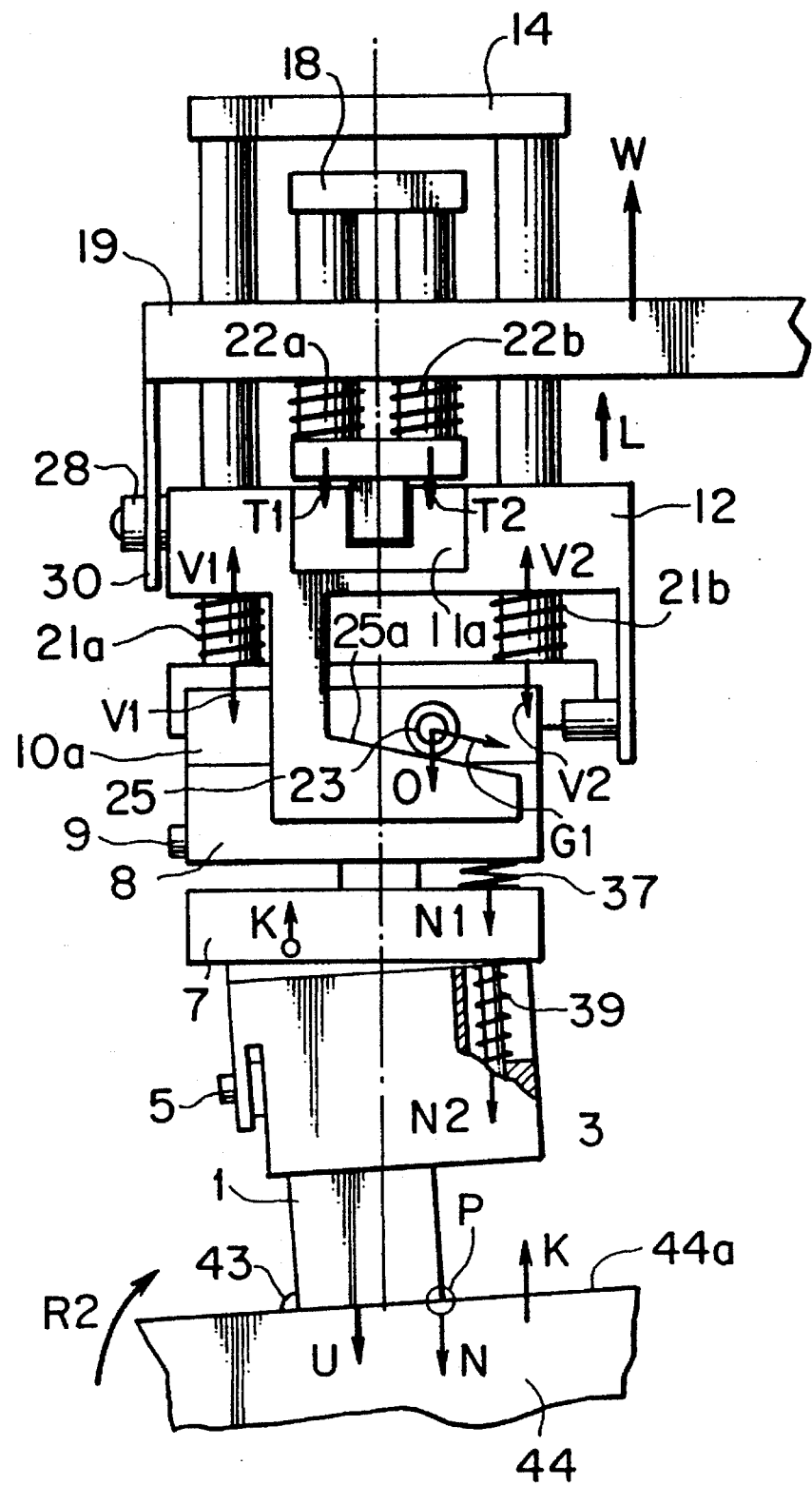

As shown in FIG. 6C in an expanded and exaggerated manner, in the course of the profile-following operation of the head 1 (for example, from the state shown by the solid line to the state shown by imaginary line), the deposition surface 1A of the head 1 presses the fluid 43 from one side 1b or P progressively to the other, which also serve to press out gas bubbles at the surface of deposition fluid 43, thereby minimizing a possibility that the bubble remains or is formed on a deposited surface 44a of the substrate 44. Furthermore, the deposition surface 1A of the head 1 follows the profile of the surface 44a of the substrate 44 without shift or displacement of the contact point P of the head 1 relative to the substrate 44. The head 1 does not move along the substrate 44. Thus, the surface 44a of the substrate 44 and the fluid deposition head 1 remain undisturbed and undamaged.

Furthermore, the fluid deposition surface 1A of the fluid deposition head 1, which surface has the plurality of projections 1a as shown in FIGS. 2A and B, can be pressed against the entire surface within the deposition area X at a uniform pressure, and therefore the deposition fluid 43 can be deposited in the form of uniform thickness layer on the entire surface within the deposition area X.

Then, referring to FIGS. 7A, 7B, 8A, and 8B, the operation upon pulling up or raising the head 1 is explained.

At the outset, when the head drive mechanism 62 (FIG. 4B) applies an upward force W to the bearing base 19 in the state shown in FIGS. 6A and B to raise the bearing base 19, the tapered guide 30 contacts the bearing 28, whereas upward forces V1 and V2 from springs 21a and 21b is applied to the bearing base 12. Thus, the bearing base 12 is pushed up in the direction L shown in FIGS. 7A and 7B, and the engagement surface 25a of the tapered guide 25 contacts the bearing 23. When the bearing base 12 is further raised, downward force J due to forces T1, T2 of springs 22a and 22b and to self-weights of the bearing 28 and base 12 is applied to the bearing 28 on the bearing base 12. Further, downward force 0 due to forces V1, V2 of springs 21a and 21b and to self-weights of the bearing 23 and base 8 is applied to the bearing 23 on the bearing base 8.

The force J applied to the bearing 28 tends to displace the bearing 28 in the direction of F1 by the action of the slope of the tapered guide 30. Likewise, the force 0 applied to the bearing 23 tends to displace the bearing 23 in the direction of G1 by the action of the tapered guide 25.

When the bearing base 19 is further raised, an upward force K is applied to the support rotation axes or shafts 9 and 7. At the same time, the fluid deposition head 1 is raised. More specifically, adhesive force U of the deposition fluid 43 between the head 1 and the substrate 44 acts as a pull-up force K to tend to pull up the substrate 44, whereas a force N resulting from forces N1 and N2 of pressing springs 37 and 39 is applied downward to the contact point P. Consequently, the fluid deposition head 1 tends to detach from a side thereof away from the point P while pressing substrate 40 at the point P.

When the bearing base 19 is further raised, the forces in the direction of F1 and G1 that act on the blocks 11a and 10a via the tapered guides 25 and 30 translationally displace the block 11a and the block 10a respectively. The forces in the direction of F1 and G1 acting on the blocks 11a, 10a and the forces K acting on the support rotation axes 9 and 7 serve to tilt the fluid deposition head 1 respectively in the directions of R1 and R2 around the contact point P serving as the fulcrum point.

This results in the detachment or separation of the fluid deposition head 1 from one side of the substrate 44 without shifting the contact point P. The projections 1a formed on the deposition surface 1A of the head 1, facilitate the separation of the deposition surface 1A of the head 1 from the fluid layer 43a (FIG. 8B) press-spread on the surface 44a of the substrate 44.

Figure 8A:
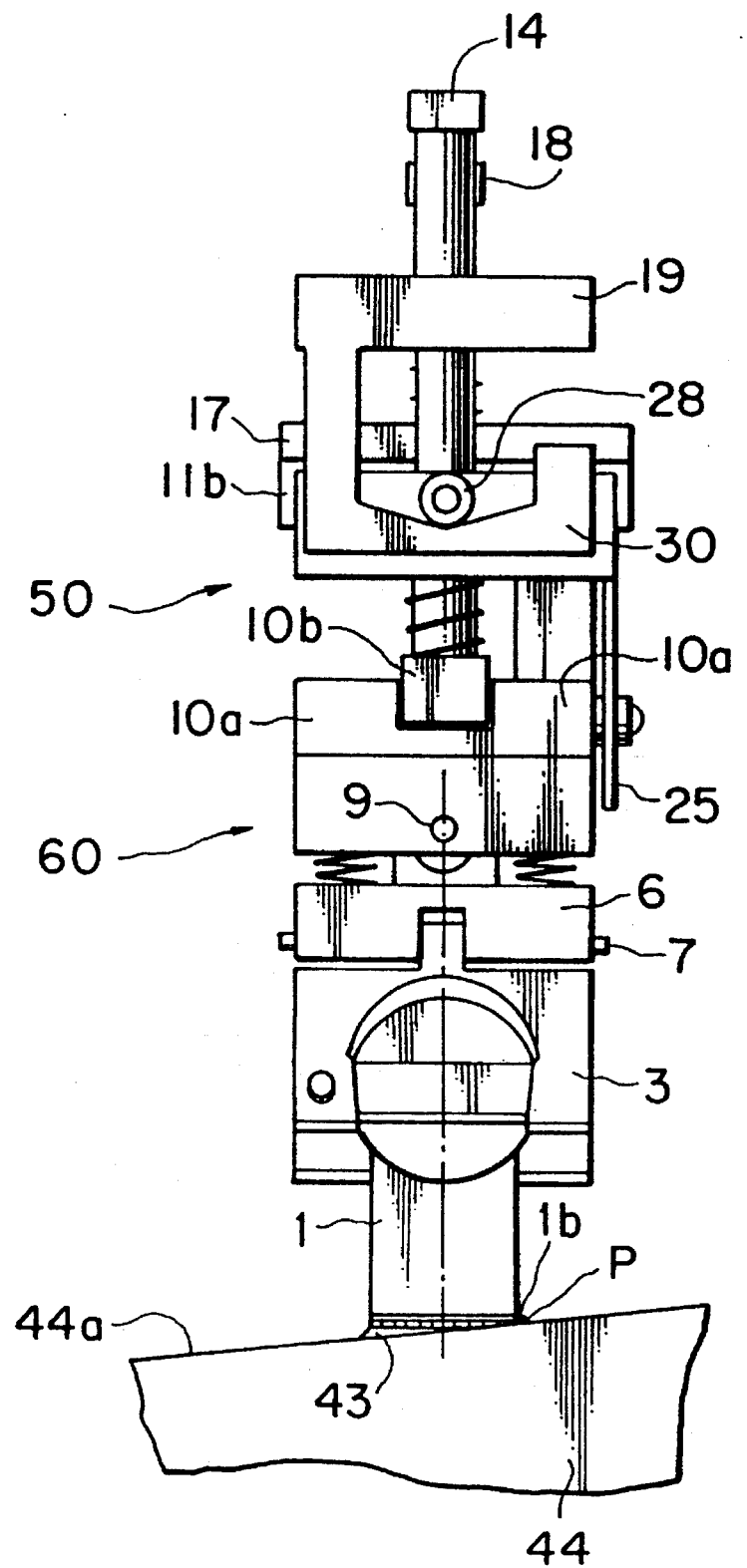
FIGS. 8A and 8B are a front view and a side view showing the second stage in head pull-up.
Figure 8B:
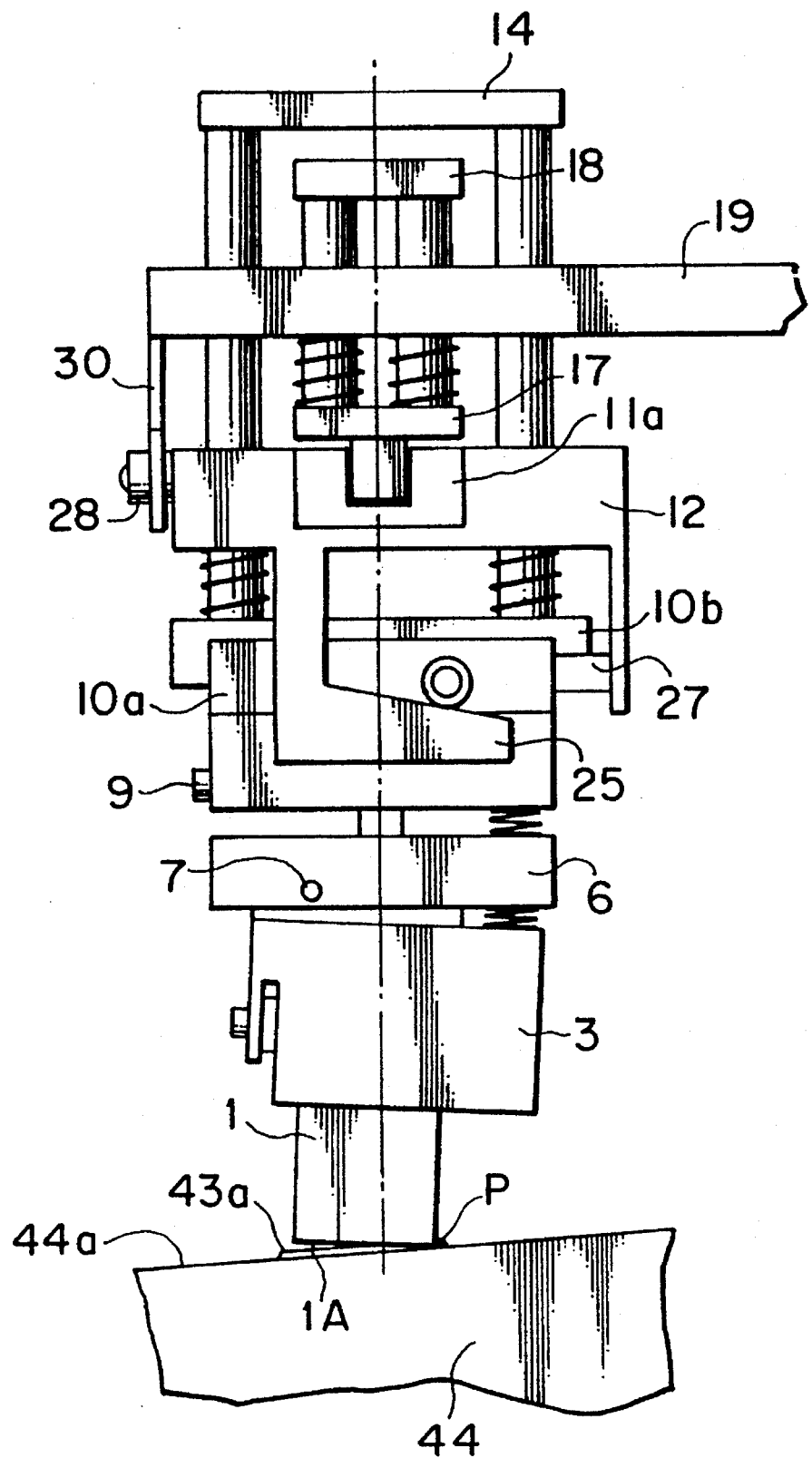

As shown in FIGS. 8A and 8B, after the fluid deposition head 1 is moved to a state contacting the substrate 44 at one side 1b (P) thereof, the blocks 10a and 11a are held at their initial stable positions by the tapered guides 25 and 30 and the positioning stopper 27, thereby returning to the state shown in FIGS. 4A and B.

After repeating operation of the above-mentioned fluid deposition with respect to each of the desired areas or sites of the substrate 44, the substrate 44 is detached from the carrier 41.

Consequently, when the deposition apparatus 60 having the profile-following mechanism 50 is used, highly viscous liquid 43 can be uniformly deposited to provide a desired thickness of uniform layer on the desired area or range of the substrate or workpiece. Thus a highly accurate thickness of deposition film or layer can be obtained.

Additionally, since a uniform, and favorable thickness of deposited layer or film of controlled amount of fluid and free of bubbles can be provided, the present invention has an advantage of providing highly accurate and highly reliable deposition under certain work conditions in flux deposition process in electronic components mounting.

The present invention is not limited to the structure of the above embodiment and can be modified in various ways so long as it does not deviate from the spirit of the invention.

Figure 9:
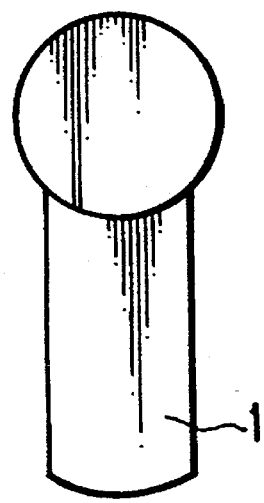
FIG. 9 is a side view showing the head according to another embodiment.

For example, the fluid deposition head 1 may be constituted, for example, as shown in FIG. 9, so that the head 1 has a convex deposition surface 1C, to conform to configuration of a part of a surface, of the workpiece, to be deposited.

Figure 10:
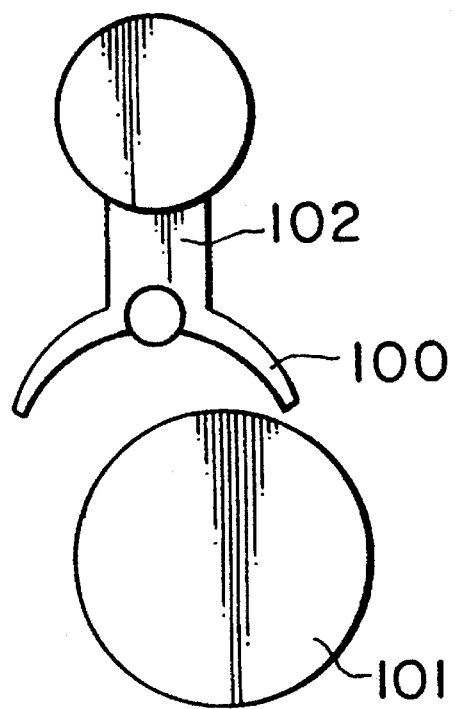
FIG. 10 is a side view showing the head according to still another embodiment.
Figure 12B:
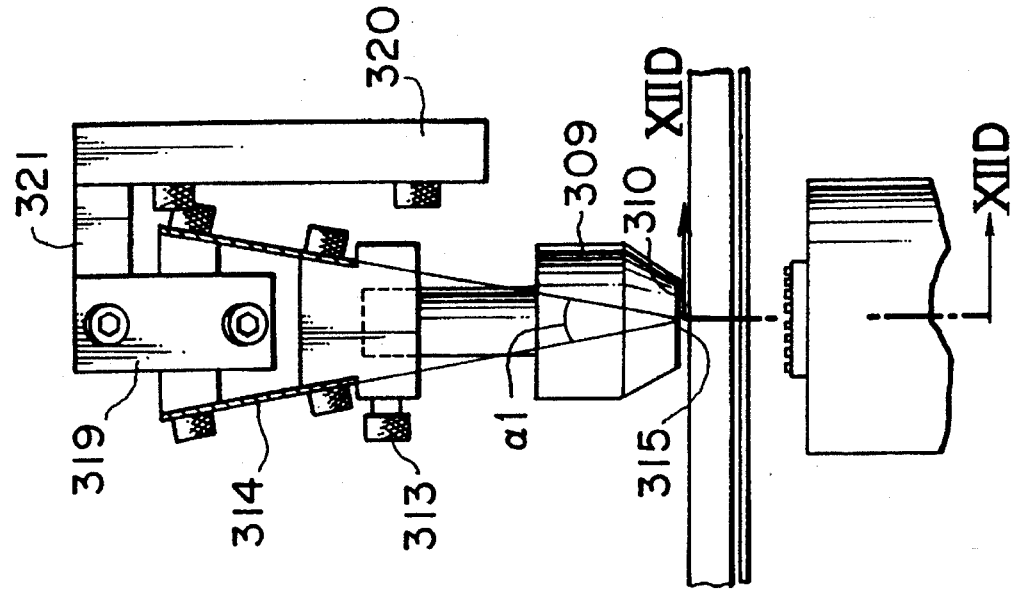
FIGS. 12A to 12D are a front view, side view, operation illustration, and a partial expanded view of a conventional profile-following mechanism.
Figure 12A:
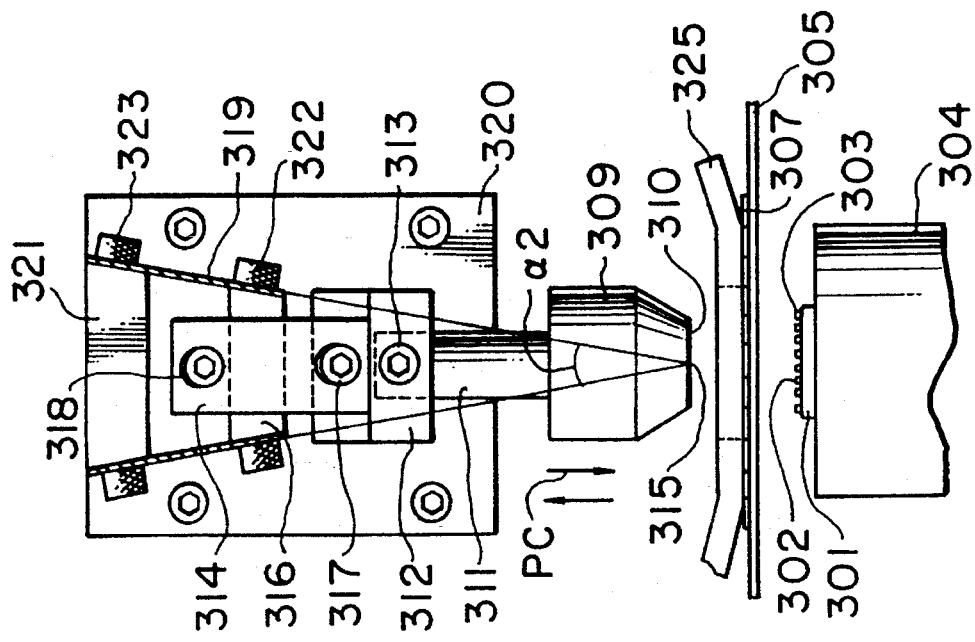
Figure 12D:
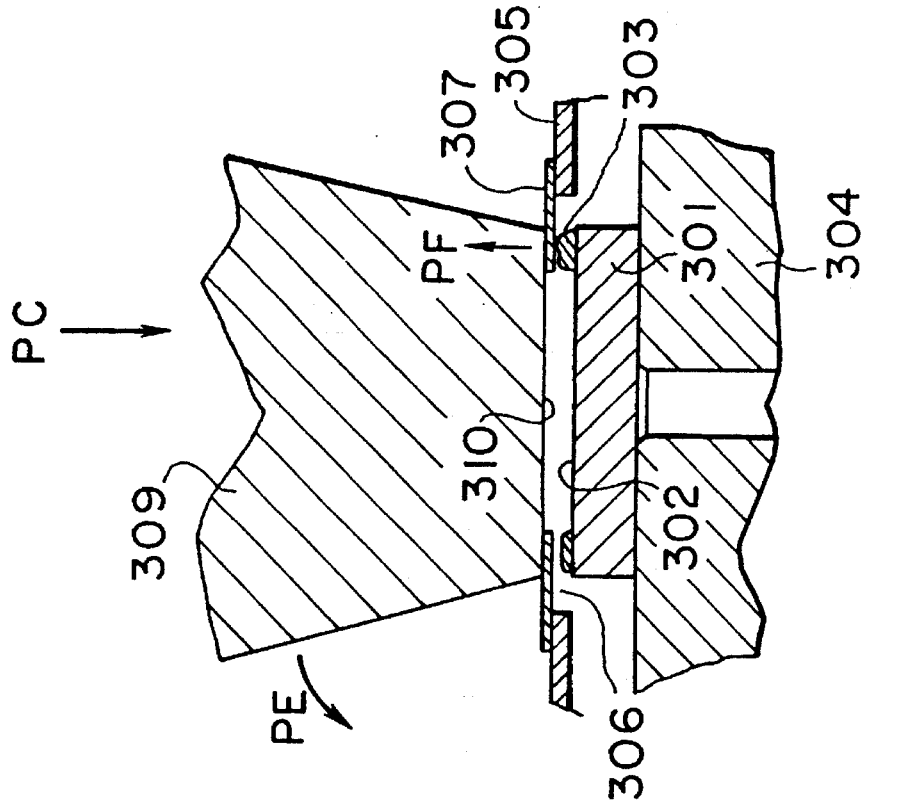
Figure 12C:
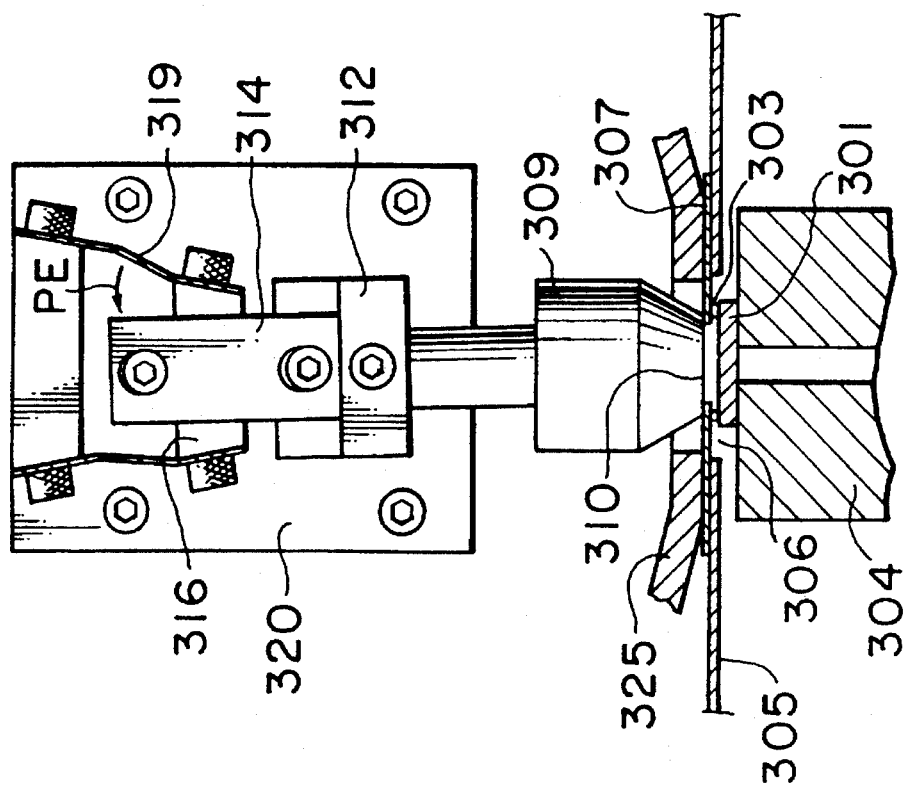

Further, aside from the deposition of fluid, a clamp 100 shown in FIG. 10 as a tool surface portion may be held in the holder case 3. In this case, the clamp 100 of a cylindrical or a spherical clamping surface holds, clamps or grasps a cylindrical or a spherical article or workpiece 101 along the cylindrical or spherical surface.

As described above, the present invention is advantageous in securing high quality of an article or workpiece in various work requiring the profile-following, because simple replacement of the head allows to carry out the work while performing the profile-following with respect to the workpiece without affecting the workpiece.

Therefore, when the present invention is applied to the chip component packaging or surface-mounting, highly viscous fluid can be uniformly deposited on the required area and at the required thickness to provide a highly accurate thickness of deposited film.

Further, since a uniform, and favorable thickness free of deposited layer or film of controlled amount of fluid and of bubbles can be provided, the present invention has an advantage of providing highly accurate and highly reliable deposition under certain work conditions in flux deposition process at electronic component mounting.

What is claimed is:

1. A deposition apparatus for depositing fluid on a surface of a workpiece, comprising:
    a deposition head having a deposition surface at a distal end thereof;
    a head-support means for supporting the deposition head at the first end thereof; and
    a head drive means connected to a second end of the head-support means to press the deposition surface of the deposition head against the surface of the workpiece;
    the head-support means having a profile-following mechanism for swingably supporting the deposition head so that the head can be swung about one edge of the deposition surface of the deposition head serving as a fulcrum until substantially an entire part of the deposition surface of the deposition head contacts the surface of the workpiece, when the head drive means applies a force, directed toward the surface of the workpiece, to the second end of the head-support means in a state where the edge contacts a part of a region of the workpiece where a droplet of highly viscous fluid is deposited;
    wherein the head drive means is adapted to move the head-support means toward the surface of the workpiece so as to move the deposition head separate from the surface of the workpiece toward the surface of the workpiece until the one edge of the deposition surface of the deposition head closest to the surface of the workpiece among edges of the deposition surface of the deposition head contacts a part of the region of the workpiece where the droplet of highly viscous fluid is deposited;
    wherein the profile-following mechanism comprises:
        a head attachment holding the deposition head;
        a first bearing stand supporting the head attachment rotatably around a first support rotation axis perpendicular to a Y axis;
        a second bearing stand supporting the first bearing stand rotatably around a second support rotation axis in the direction of the Y axis;
        a first translational displacement means engaged with the second bearing stand displaceably thereto in the direction of the Y axis;
        a first bearing base engaged in pressing relation with the first translational displacement means in a direction of Z axis via a first elastic means, the first bearing base having a first guide for regulating an amount of displacement of the first translational displacement means in the direction of the Y axis with respect to the second bearing stand upon application and release of pressure directed toward the first translational displacement means;
        a second translational displacement means engaged with the first bearing base displaceably thereto in a direction of X axis; and
        a second bearing based engaged in pressing relation with the second translational displacement means in the direction of the Z axis via a second elastic means, the second bearing base having a second guide for regulating an amount of displacement of the second translational displacement means in the direction of the X axis with respect to the first bearing base upon application and release of pressure directed toward the second translational displacement means.

2. A deposition apparatus according to claim 1 wherein the first bearing base is adapted to transmit pressure directed toward the first displacement means to the first bearing stand via the first displacement means and the second bearing stand so as to rotate the first bearing stand around the first support rotation axis with respect to the deposition head so that the deposition surface of the deposition head follows a profile of the surface of the workpiece in the direction of the Y axis around the one edge of the deposition head serving as the fulcrum with respect to the workpiece, and so as to allow the first displacement means to be displaced with respect to the second bearing stand in the direction of the Y axis.

3. A deposition apparatus according to claim 2 wherein the above second bearing base is adapted to transmit pressure directed toward the second displacement means to the second displacement means and the first bearing base so as to rotate the second bearing stand around the second support rotation axis with respect to the deposition head so that the deposition surface of the deposition head follows the profile of the surface of the workpiece in the direction of the X axis around the one edge of the deposition head serving as the fulcrum with respect to the workpiece, and so as to allow the second displacement means to be displaced in the direction of the X axis with respect to the first bearing base.

4. A deposition apparatus according to claim 1 wherein the second bearing stand has a first engagement portion adapted to be engaged with the first guide of the first bearing base so that the amount of displacement of the first displacement means in the direction of the Y axis with respect to second bearing stand is regulated upon application and release of the pressure directed toward the first displacement means.

5. A deposition apparatus according to claim 1 wherein the first bearing base has a second engagement portion adapted to be engaged with the second guide of the second bearing base so that the amount of displacement of the second displacement means in the direction of the X axis with respect to the first bearing base is regulated upon application and release of the pressure directed toward the second displacement means.

6. A deposition apparatus according to claim 1 wherein the head attachment is adapted to hold the deposition head detachably.

7. A profile-following device comprising:
   a head having a tool surface portion for performing a predetermined operation with respect to a workpiece;
   a head attachment holding the head;
   a first bearing stand supporting the first bearing stand rotatably around a first support rotation axis perpendicular to a Y axis;
   a second bearing stand supporting the first bearing stand rotatably around a second support rotation axis in the direction of the Y axis;
   a first translational displacement means engaged with the second bearing stand displaceably thereto in the direction of the Y axis;
   a first bearing base engaged in pressing relation with the first displacement means via a first elastic means in a direction of Z axis, the first bearing base having a first guide for regulating an amount of displacement of the first displacement means in the direction of the Y axis with respect to the second bearing stand upon application and release of a pressure directed toward the first displacement means;
   a second translational displacement means engaged with the first bearing base displaceably thereto in a direction of X axis; and
   a second bearing base engaged in pressing relation with the second displacement means via a second elastic means in the direction of the Z axis, the second bearing base having a second guide for regulating an amount of displacement of the second displacement means with respect to the first bearing base in the direction of the X axis upon application and release of pressure directed toward the second displacement means;
   wherein a line of action of a force applied to the head in response to the pressure applied to the second bearing base is offset from a first contact point, of the tool surface of the head, to be contacted first with the workpiece and intersects the tool surface of the head.

8. A profile-following device according to claim 7 wherein the first bearing base is adapted to transmit pressure directed toward the first displacement means to the first bearing stand via the first displacement means and the second bearing stand so as to rotate the first bearing stand around the first support rotation axis with respect to the head so that the tool surface of the head follows a profile of a contacted surface of the workpiece in the direction of the Y axis around the first contact point of the tool surface of the head, and so as to allow the first displacement means to be displaced in the direction of the Y axis with respect to the second bearing stand.

9. A profile-following device according to claim 8 wherein the second bearing base is adapted to transmit pressure directed toward the second displacement means to the first bearing stand through the second displacement means and the first bearing base so as to rotate the second bearing stand with respect to the head around the second support rotation axis so that the tool surface of the head follows the profile of the contacted surface of the workpiece in the direction of the X axis around the first contact point of the tool surface, and so as to allow the second displacement means to be displaced in the direction of the X axis with respect to the first bearing base.

10. A profile-following device according to claim 7 wherein the second bearing stand has a first engagement portion engaged with the first guide of the first bearing base so that the amount of displacement of the first displacement means in the direction of the Y axis with respect to the second bearing stand is regulated upon application and release of the pressure directed toward the first displacement means.

11. A profile-following device according to claim 10 wherein the first guide comprises a generally L-shaped extension having a slope engaged with the first engagement portion and the first engagement portion comprises a roller capable of rolling on the slope.

12. A profile-following device according to claim 7 wherein the first bearing base has a second engagement portion engaged with the second guide of the second bearing base so that the amount of displacement of the second displacement means in the direction of the X axis with respect to the first bearing base is regulated upon application and release of the pressure directed toward the second displacement means.

13. A profile-following device according to claim 12 wherein the second guide comprises a generally L-shaped extension having a V-shaped guide surface engaged with the second engagement portion, and the second engagement portion comprises a roller capable of rolling on the V-shaped guide surface.

14. A profile-following device according to claim 7 wherein the head attachment is adapted to hold the head detachably.

15. A profile-following device according to claim 7 wherein the head is tilted with respect to the first bearing stand so that a specific edge, among edges, of the tool surface constitutes the first contact point.

16. A profile-following device according to claim 7 wherein an angle of the tilting of the head is adjustable.

17. A profile-following device according to claim 7 wherein the head is a deposition head for depositing highly viscous fluid on the contacted surface of the workpiece and the tool surface portion comprises a deposition surface of the deposition head.

18. A profile-following device according to claim 7 wherein the head is a clamping head for clamping the workpiece and the tool surface portion comprises a clamp for clamping the workpiece.

* * * * *